(12) United States Patent
Lee et al.

(10) Patent No.: US 8,502,623 B2
(45) Date of Patent: Aug. 6, 2013

(54) BAND PASS FILTER

(75) Inventors: Pao-Nan Lee, Pingtung County (TW);
Chi-Tsung Chiu, Kaoshiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 1218 days.

(21) Appl. No.: 12/366,898

(22) Filed: Feb. 6, 2009

(65) Prior Publication Data

US 2010/0007438 A1    Jan. 14, 2010

(30) Foreign Application Priority Data

Jul. 9, 2008  (TW) ................................ 97125979 A

(51) Int. Cl.
*H03H 7/01*  (2006.01)
(52) U.S. Cl.
USPC .......................................... 333/175; 333/185
(58) Field of Classification Search
USPC ................... 333/175, 185, 204, 205, 219, 235
See application file for complete search history.

(56) References Cited

U.S. PATENT DOCUMENTS

| | | | |
|---|---|---|---|
| 5,541,558 A * | 7/1996 | Weber et al. | 333/174 |
| 7,023,301 B2 | 4/2006 | Kawahara et al. | |
| 7,068,124 B2 | 6/2006 | White et al. | |
| 7,667,557 B2 * | 2/2010 | Chen | 333/185 |
| 2006/0038635 A1 * | 2/2006 | Richiuso et al. | 333/177 |
| 2006/0279380 A1 | 12/2006 | Chung et al. | |
| 2008/0116998 A1 | 5/2008 | Sekine et al. | |

OTHER PUBLICATIONS

"Office Action of Taiwan Counterpart Application", issued on Dec. 14, 2011, p. 1-p. 5.

* cited by examiner

*Primary Examiner* — Benny Lee
*Assistant Examiner* — Gerald Stevens
(74) *Attorney, Agent, or Firm* — J.C. Patents

(57) ABSTRACT

A band pass filter includes an original circuit. An interaction of at least two of components of the original circuit produces at least a mutual capacitor or at least a mutual inductor, which constitutes a resonance circuit with the original circuit to produce at least a transmission zero for increasing the attenuation rate of the stop band.

5 Claims, 25 Drawing Sheets

BAND PASS FILTER

CROSS-REFERENCE TO RELATED APPLICATION

This application claims the priority benefit of Taiwan application serial no. 97125979, filed on Jul. 9, 2008. The entirety of the above-mentioned patent application is hereby incorporated by reference herein and made a part of specification.

BACKGROUND OF THE INVENTION

1. Field of the Invention

The present invention relates to a band pass filter.

2. Description of Related Art

Along with the progress of technology, wireless communication systems such as cell phones, Bluetooth, cordless phone, wireless local area network (WLAN) are gradually popularized. The wireless communication system is mostly provided with a band pass filter, and mainly functions for allowing signals of the pass band to pass through, and filtering other interference signals except those of the pass band. In order to achieve a better filter effect, the resonance circuit is used to increase the transmission zero of the band pass filter, so as to increase the attenuation rate of the stop band (i.e. frequency bands other than the pass band). However, the resonance circuit usually causes the decrease of the response of the pass band, and the increase of the space required for the layout.

SUMMARY OF THE INVENTION

The present invention is directed to a band pass filter, for increasing the transmission zero to increase the attenuation rate of the stop band.

The present invention provides a band pass filter, which includes a first serial inductor, a first serial capacitor, a second serial capacitor, a second serial inductor, a first branch capacitor, a second branch capacitor, a central capacitor, and a central inductor. One end of the first serial capacitor is electrically connected to one end of the first serial inductor. One end of the second serial capacitor is electrically connected to the other end of the first serial capacitor. One end of the second serial inductor is electrically connected to the other end of the second serial capacitor. One end of the first branch capacitor is electrically connected to the other end of the first serial inductor, and the other end is electrically connected to ground. One end of the second branch capacitor is electrically connected to the other end of the second serial capacitor, and the other end is electrically connected to ground. One end of the central capacitor is electrically connected to the other end of the first serial capacitor, and the other end is electrically connected to ground. One end of the central inductor is electrically connected to the other end of the first serial capacitor, and the other end is electrically connected to ground. The above elements form an original circuit. An interaction of at least two of the above elements produces at least a mutual capacitor or at least a mutual inductor, which constitutes a resonance circuit with the original circuit to produce at least a transmission zero.

Based on the above, in the present invention, an mutual circuit formed by the mutual capacitor or the mutual inductor produced between the elements of original circuit of the band pass filter constitutes the resonance circuit with the original circuit to produce one or more transmission zero, so as to increase the attenuation rate of the stop band.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
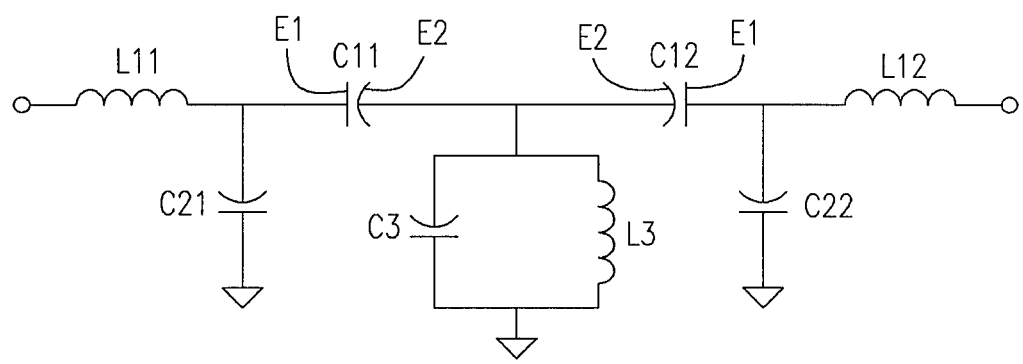
FIG. 1 illustrates an original circuit of a band pass filter of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates an original circuit of a band pass filter of the present invention. Referring to FIG. 1, a band pass filter 100 includes multiple passive elements electrically connected in a certain relation. The band pass filter 100 includes a first serial inductor L11, a first serial capacitor C11, a second serial capacitor C12, and a second serial inductor L12. One end of the first serial capacitor C11 is electrically connected to one end of the first serial inductor L11. One end of the second serial capacitor C12 is electrically connected to the other end of the first serial capacitor C11. One end of the second serial inductor L12 is electrically connected to the other end of the second serial capacitor C12.

Furthermore, the band pass filter 100 further includes a first branch capacitor C21 and a second branch capacitor C22. One end of the first branch capacitor C21 is electrically connected to the other end of the first serial inductor L11, and the other end is electrically connected to ground. One end of the second branch capacitor C22 is electrically connected to the other end of the second serial capacitor L11, and the other end is electrically connected to ground. In addition, the band pass filter 100 further includes a central capacitor C3 and a central inductor L3. One end of the central capacitor C3 is electrically connected to the other end of the first serial capacitor C11, and the other end is electrically connected to ground. One end of the central inductor L3 is electrically connected to the other end of the first serial capacitor, and the other end is electrically connected to ground.

Figure 2:
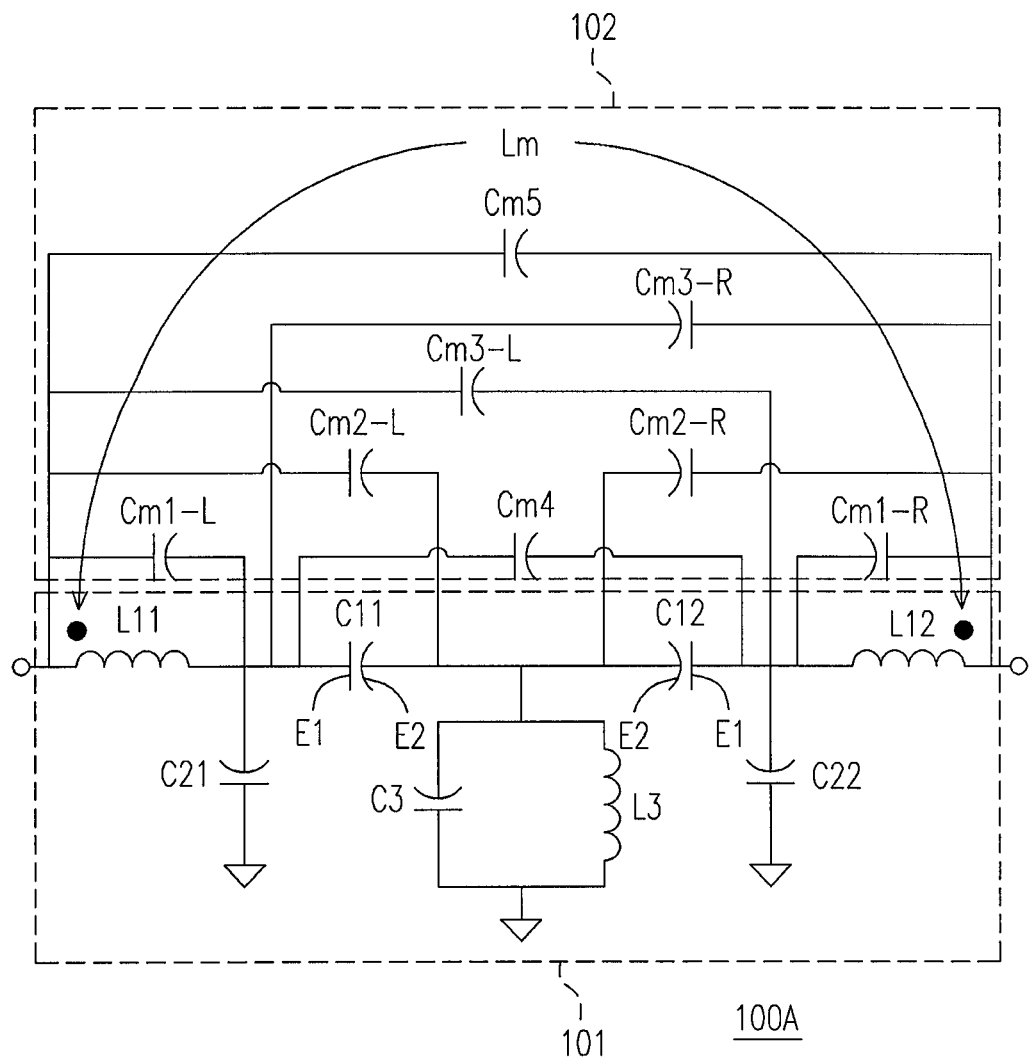
FIG. 2 illustrates an original circuit and an mutual circuit of the band pass filter of the present invention.

FIG. 2 illustrates an original circuit and an mutual circuit of the band pass filter of the present invention. Referring to FIG. 2, in order to increase the transmission zero to increase the attenuation rate of the stop band, the band pass filter 100A further includes an mutual circuit 102 in addition to the original circuit 101. The mutual circuit 102 includes the mutual capacitor or mutual inductor produced from the elements of the original circuit. Furthermore, the mutual circuit 102 and the original circuit 101 constitute a resonance circuit to produce one or more transmission zeros.

Referring to FIG. 2 again, the mutual capacitor Cm1-L may be produced from an interaction between the first serial inductor L11 and a planar electrode E2 of the first serial capacitor C11. The mutual capacitor Cm1-R may be produced from an interaction between the second serial inductor L12 and a planar electrode E2 of the second serial capacitor C12. The mutual capacitor Cm2-L may be produced from an interaction between the first serial inductor L11 and the planar electrode E1 of the first serial capacitor C11. The mutual capacitor Cm2-R may be produced from an interaction between the second serial inductor L12 and the planar electrode E1 of the second serial capacitor C12.

Accordingly, the mutual capacitor Cm3-L is produced from an interaction between the first serial inductor L11 and the second serial capacitor C12. The mutual capacitor Cm3-R is produced from an interaction between the second serial inductor L12 and the first serial capacitor C11. The mutual capacitor Cm4 may be produced from an interaction between the first serial capacitor C11 and the second serial capacitor C12. The mutual capacitor Cm5 may be produced from an interaction between the first serial inductor L11 and the second serial inductor L12. The mutual inductor Lm5 may be produced from an interaction between the first serial inductor L11 and the second serial inductor L12.

The mutual capacitors Cm1-Cm5 and the mutual inductor Lm of an mutual circuit 102 of FIG. 2 may be achieved by altering a three-dimensional layout of a band pass filter.

Figure 3A:
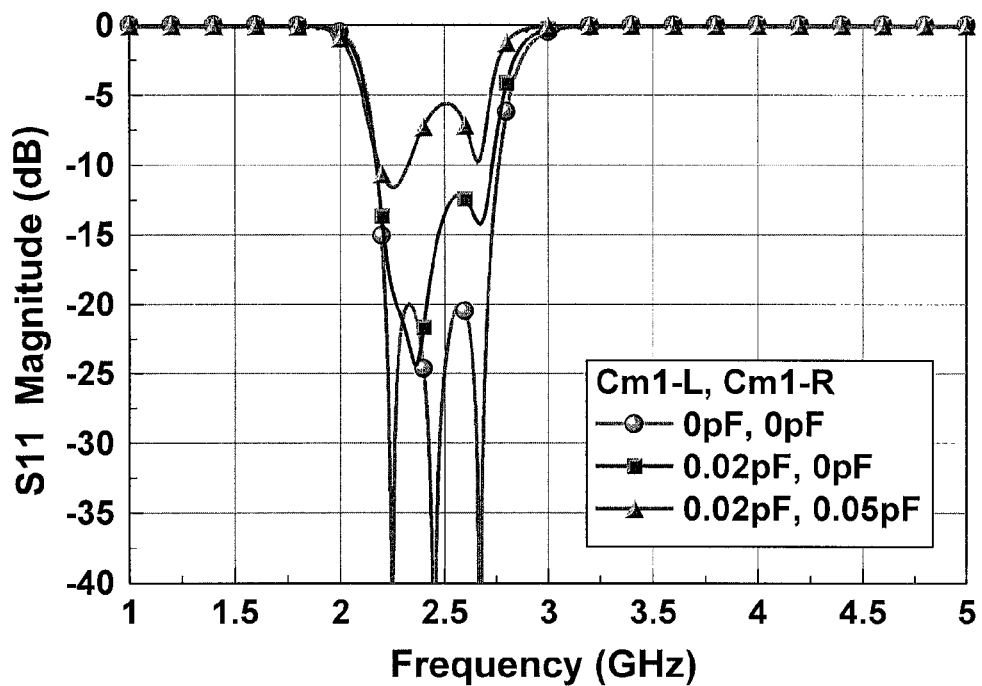
FIGS. 3A and 3B respectively illustrate comparison of a mutual capacitor Cm1-L and a mutual capacitor Cm1-R of FIG. 2 under different scatter parameters.
Figure 3B:
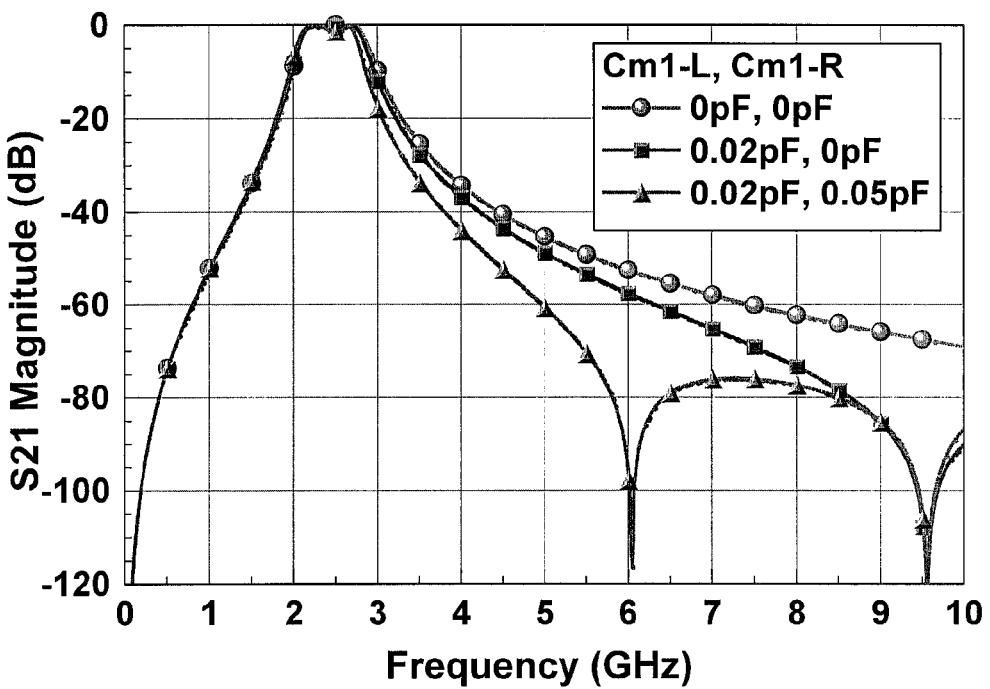

FIGS. 3A and 3B respectively illustrate comparison of a mutual capacitor Cm1-L and a mutual capacitor Cm1-R of FIG. 2 under different scatter parameters. Referring to FIG. 3A, the coexisting of the mutual capacitor Cm1-L and the mutual capacitor Cm1-R may improve the response intensity of the input signal. Referring to FIG. 3B, the coexisting of the mutual capacitor Cm1-L and the mutual capacitor Cm1-R may produces two transmission zeros, so as to improve the noise reduction of the output signal.

Figure 4A:
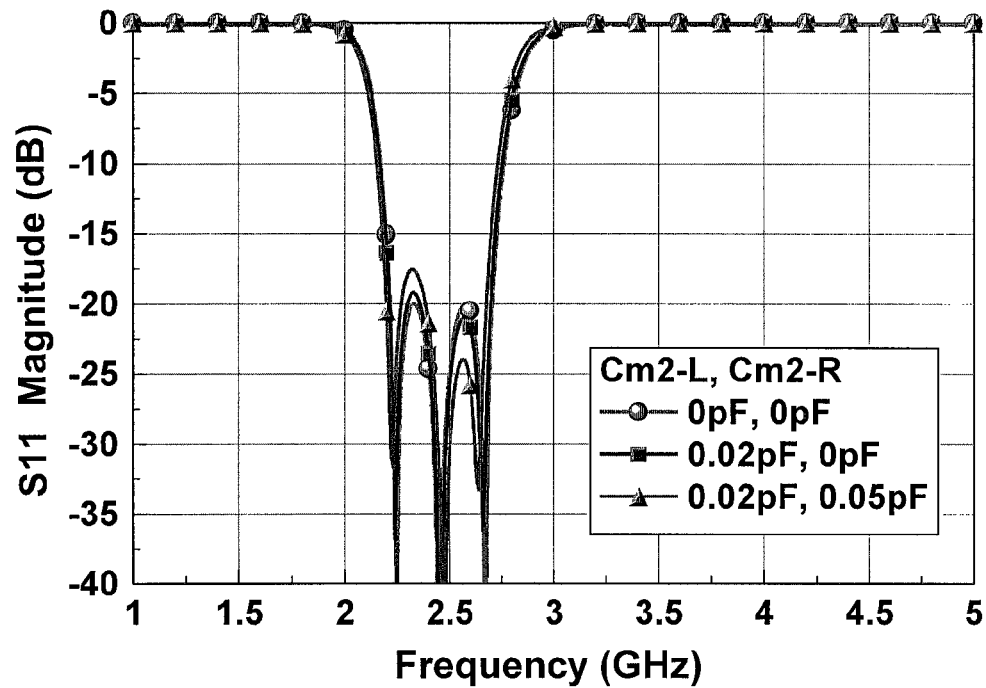
FIGS. 4A and 4B respectively illustrate comparison of a mutual capacitor Cm2-L and a mutual capacitor Cm2-R of FIG. 2 under different scatter parameters.
Figure 4B:
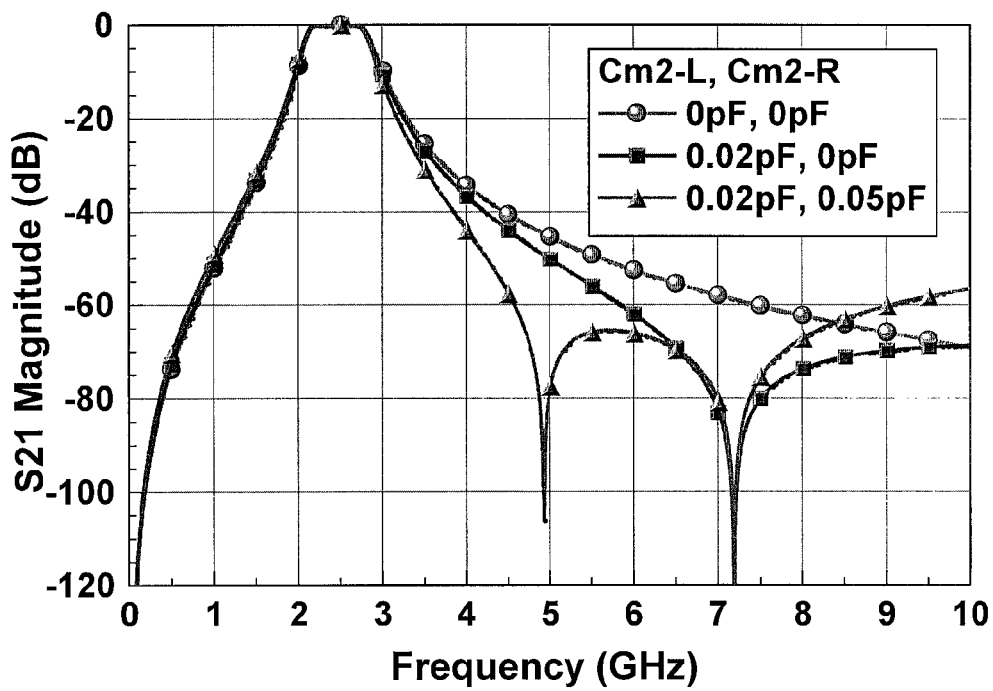

FIGS. 4A and 4B respectively illustrate comparison of a mutual capacitor Cm2-L and a mutual capacitor Cm2-R of FIG. 2 under different scatter parameters. Referring to FIG. 4A, the coexisting of mutual capacitor Cm2-L and the mutual capacitor Cm2-R substantially maintains the response intensity of the input signal. Referring to FIG. 4B, the coexisting of the mutual capacitor Cm2-L and the mutual capacitor Cm2-R may produce two transmission zeros, so as to improve the noise reduction of the output signal.

Figure 5A:
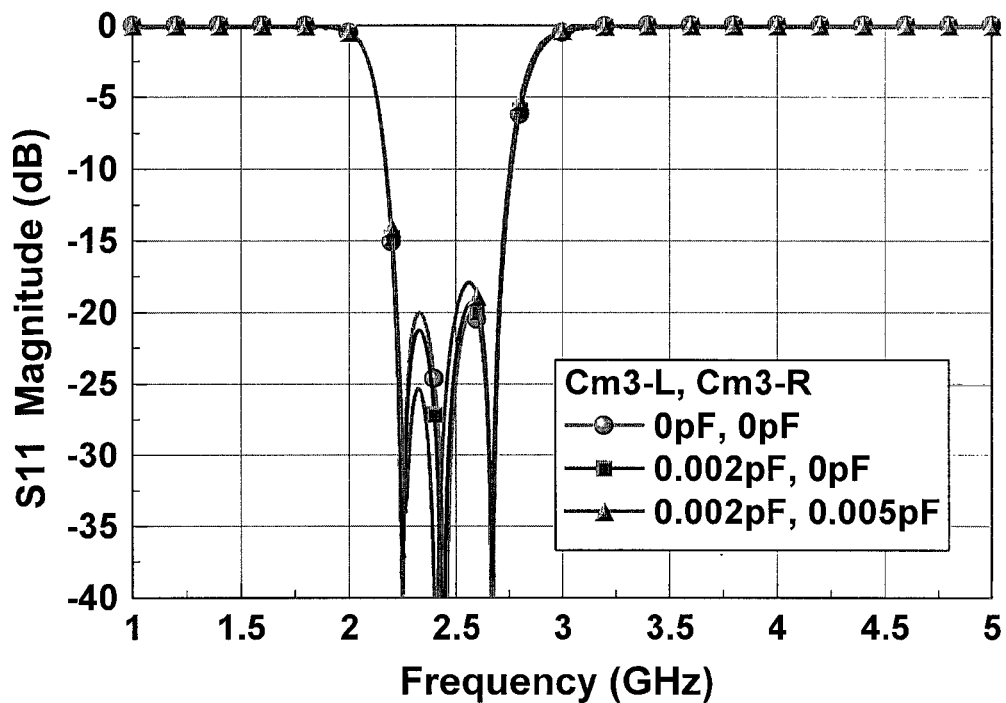
FIGS. 5A and 5B respectively illustrate comparison of a mutual capacitor Cm3-L and a mutual capacitor Cm3-R of FIG. 2 under different scatter parameters.
Figure 5B:
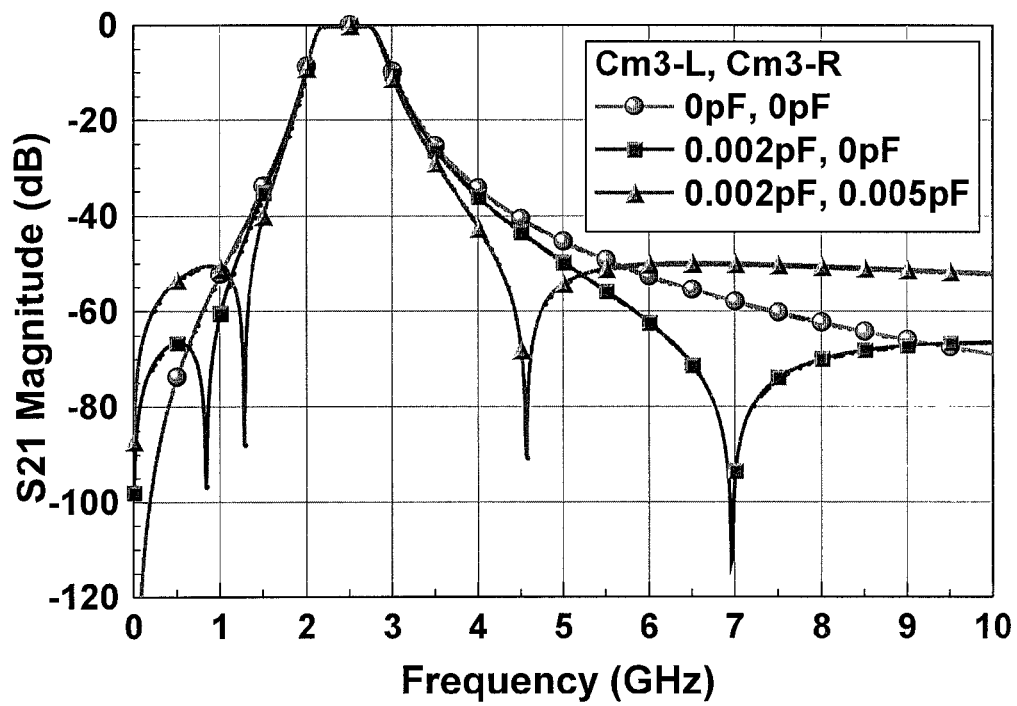

FIGS. 5A and 5B respectively illustrate comparison of a mutual capacitor Cm3-L and a mutual capacitor Cm3-R of FIG. 2 under different scatter parameters. Referring to FIG. 5A, the coexisting of the mutual capacitor Cm3-L and the mutual capacitor Cm3-R substantially maintains the response intensity of the input signal. Referring to FIG. 5B, the coexisting of the mutual capacitor Cm3-L and the mutual capacitor Cm3-R may produce two transmission zeros, so as to improve the noise reduction of the output signal.

Figure 6A:
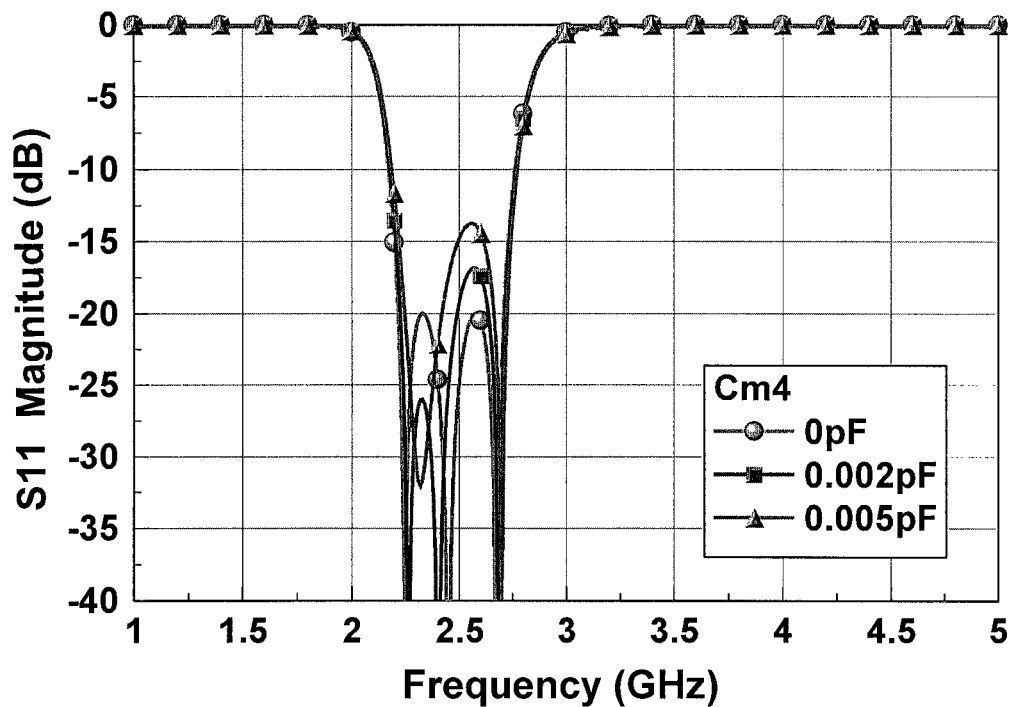
FIGS. 6A and 6B respectively illustrate comparison of a mutual capacitor Cm4 of FIG. 2 under different scatter parameters.
Figure 6B:
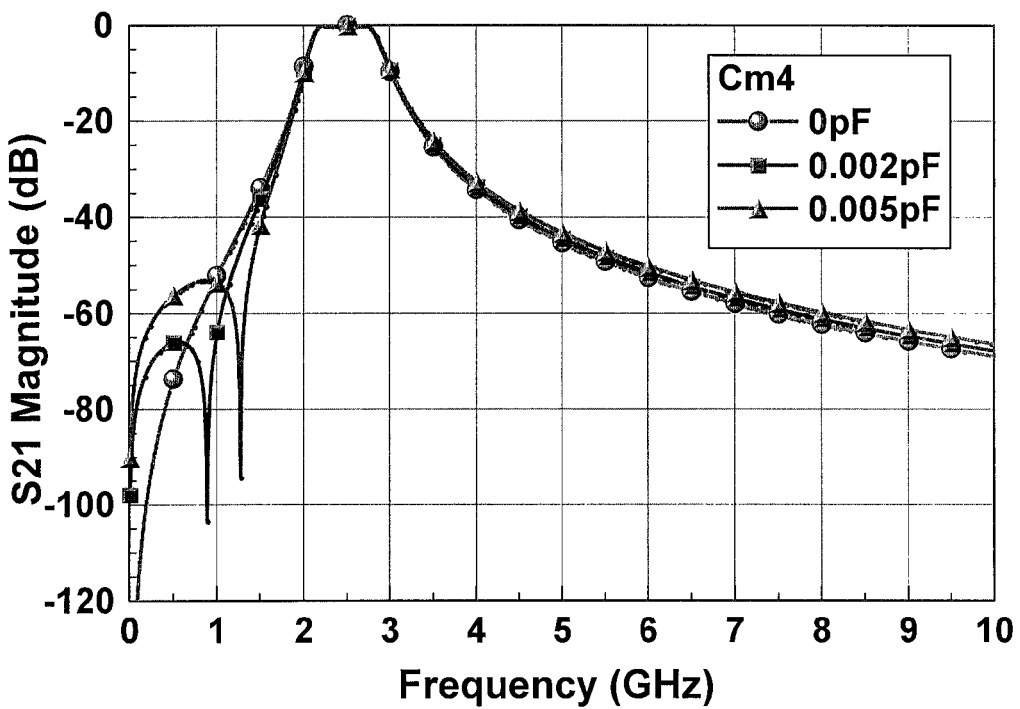

FIGS. 6A and 6B respectively illustrate comparison of a mutual capacitor Cm4 of FIG. 2 under different scatter parameters. Referring to FIG. 6A, the existing of the mutual capacitor Cm4 slightly improves the response intensity of the input signal. Referring to FIG. 6B, the existing of the mutual capacitor Cm4 may produce one transmission zero, so as to improve the noise reduction of the output signal.

Figure 7A:
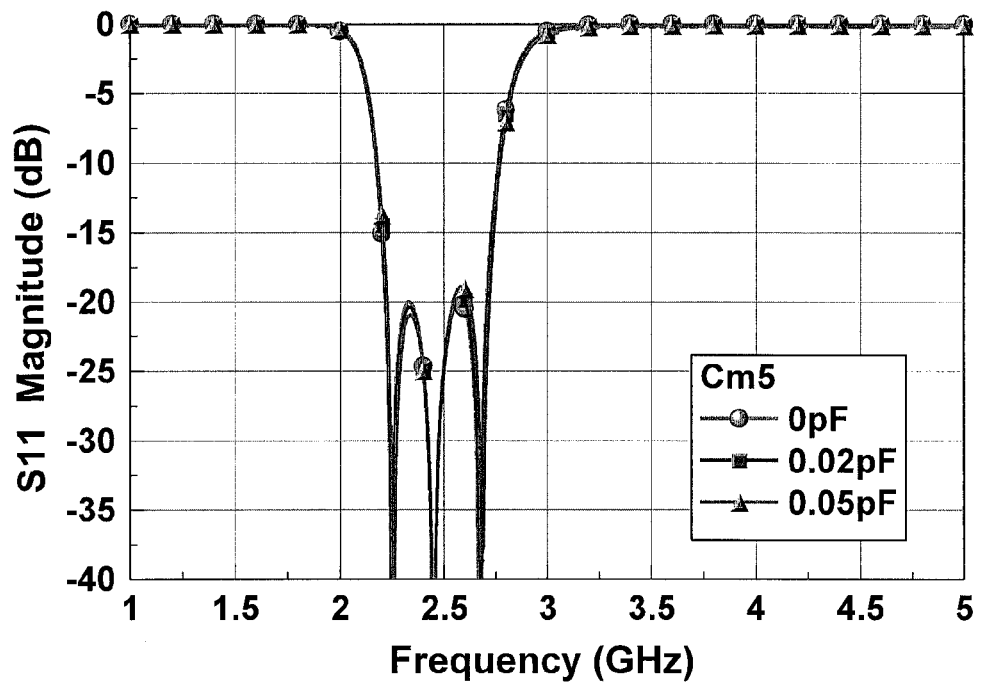
FIGS. 7A and 7B respectively illustrate comparison of mutual capacitor Cm5 of FIG. 2 under different scatter parameters.
Figure 7B:
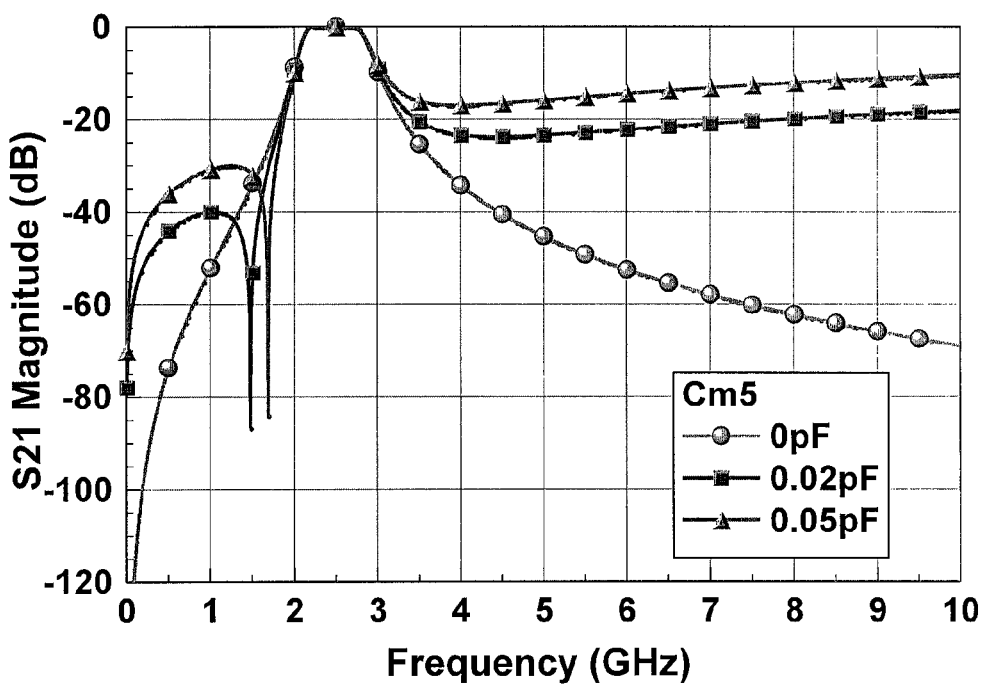

FIGS. 7A and 7B respectively illustrate comparison of mutual capacitor Cm5 of FIG. 2 under different scatter parameters. Referring to FIG. 7A, the existing of the mutual capacitor Cm5 substantially maintains the response intensity of the input signal. Referring to FIG. 7B, the existing of the mutual capacitor Cm5 may produce one transmission zero, so as to improve the noise reduction of the output signal.

Figure 8A:
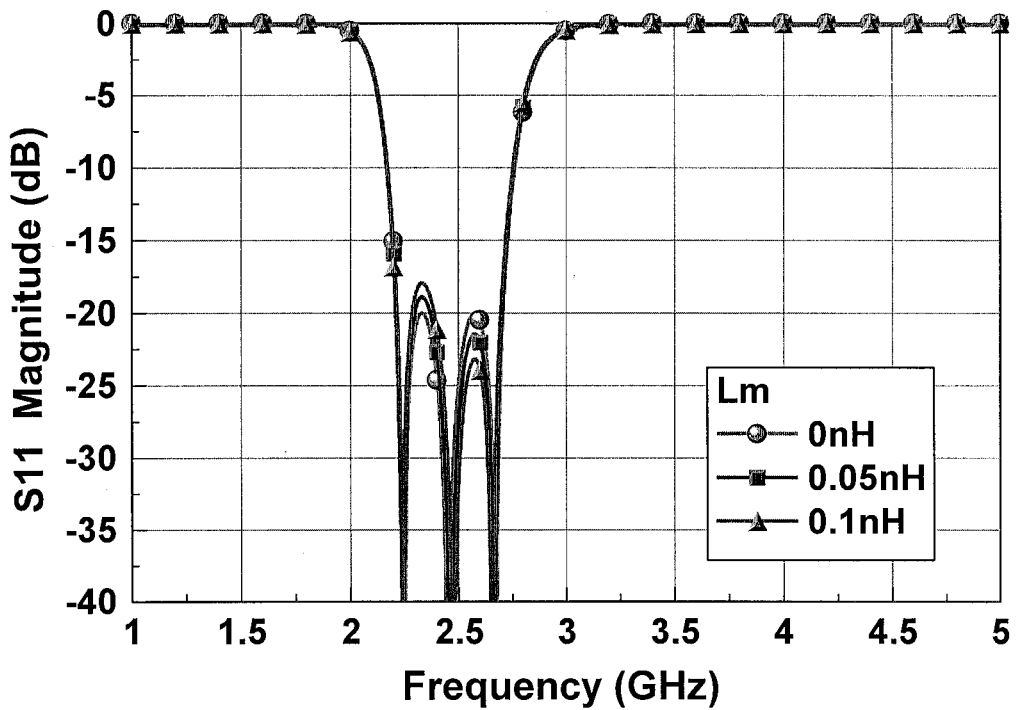
FIGS. 8A and 8B respectively illustrate comparison of a mutual capacitor Lm of FIG. 2 under different scatter parameters.
Figure 8B:
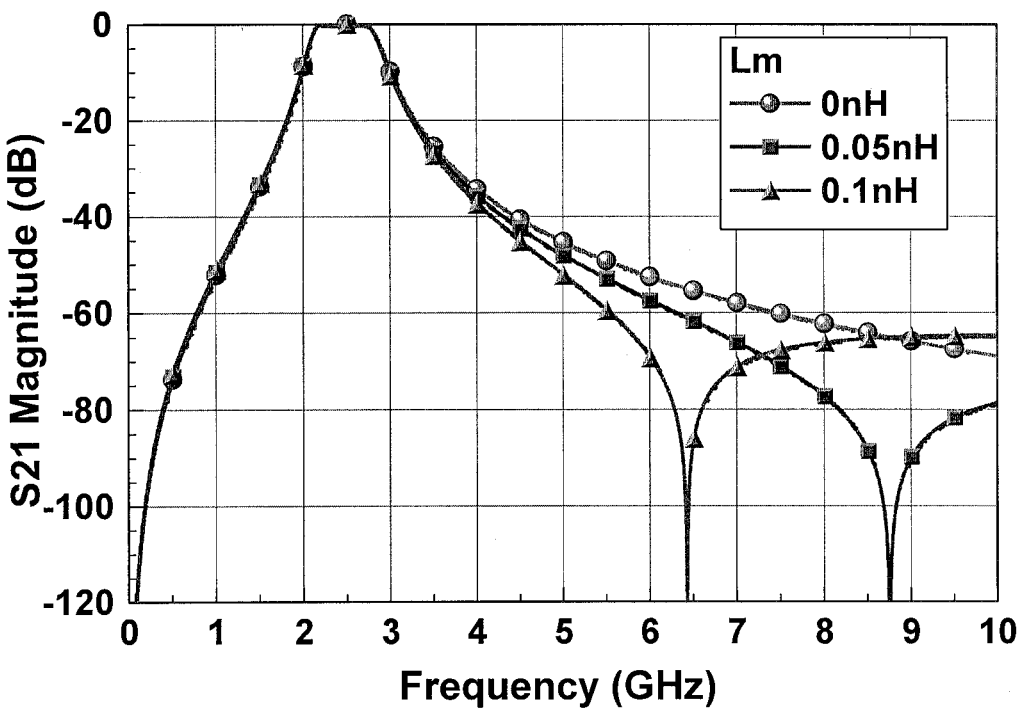

FIGS. 8A and 8B respectively illustrate comparison of a mutual capacitor Lm of FIG. 2 under different scatter parameters. Referring to FIG. 8A, the existing of the mutual capacitor Lm substantially maintains the response intensity of the input signal. Referring to FIG. 8B, the existing of the mutual capacitor Lm may produce one transmission zero, so as to improve the noise reduction of the output signal.

Figure 9:
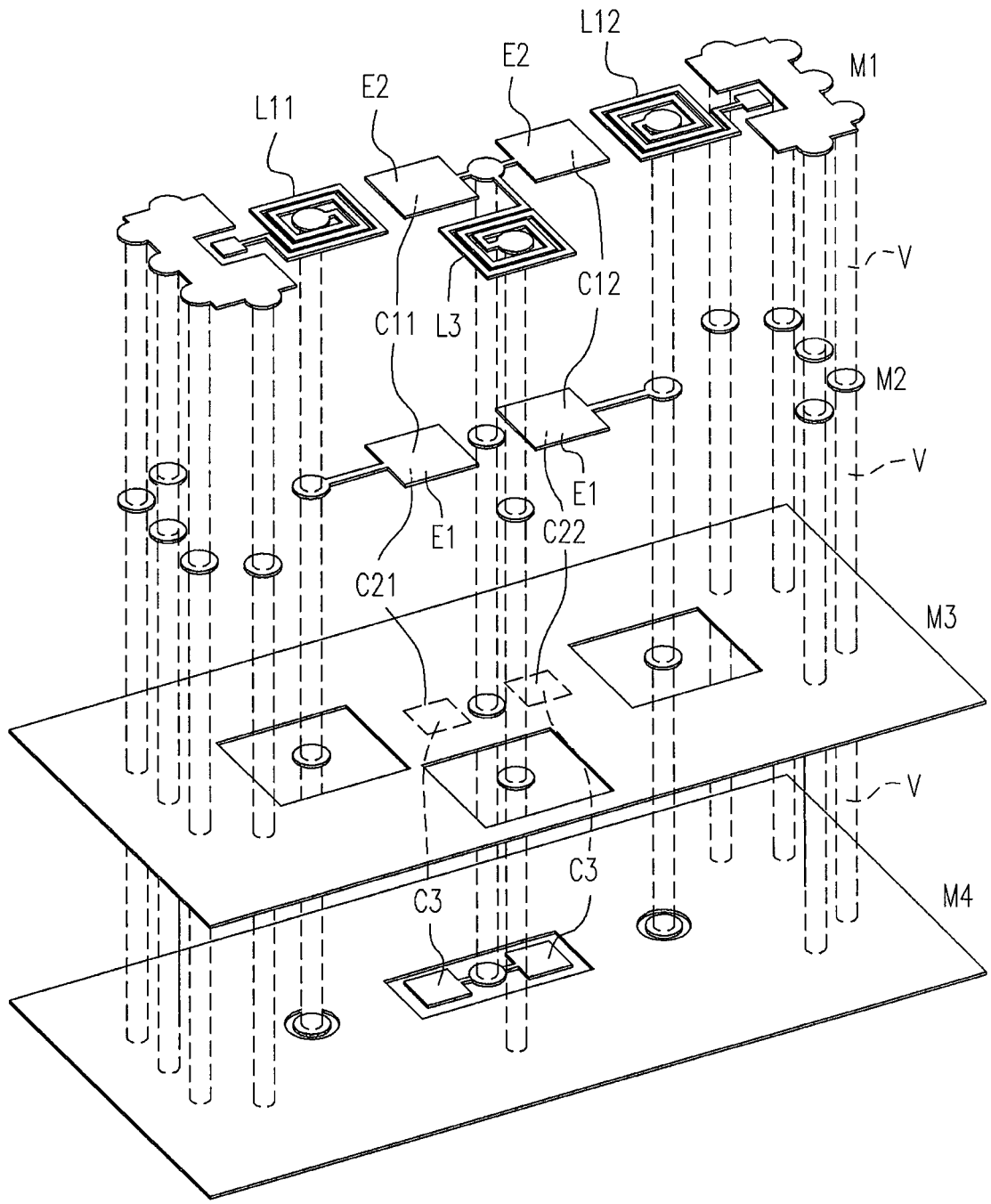
FIG. 9 illustrates a three-dimensional layout of a band pass filter according to an embodiment of the present invention.

FIG. 9 illustrates a three-dimensional layout of a band pass filter according to an embodiment of the present invention. Referring to FIG. 9, in this embodiment, a band pass filter realized by a three-dimensional layout includes plural conductive pattern layers M1-M4 and the plural conductive vias V, in which the conductive vias V are used to connect the conductive pattern layers M1-M4. The band pass filter 200 realized by a three-dimensional layout includes a first serial inductor L11, a first serial capacitor C11, a second serial capacitor C12, a second serial inductor L12, a first branch capacitor C21, a second branch capacitor C22, a central capacitor C3, and a central inductor L3, and the connection relations are as shown in FIG. 2.

Figure 10:
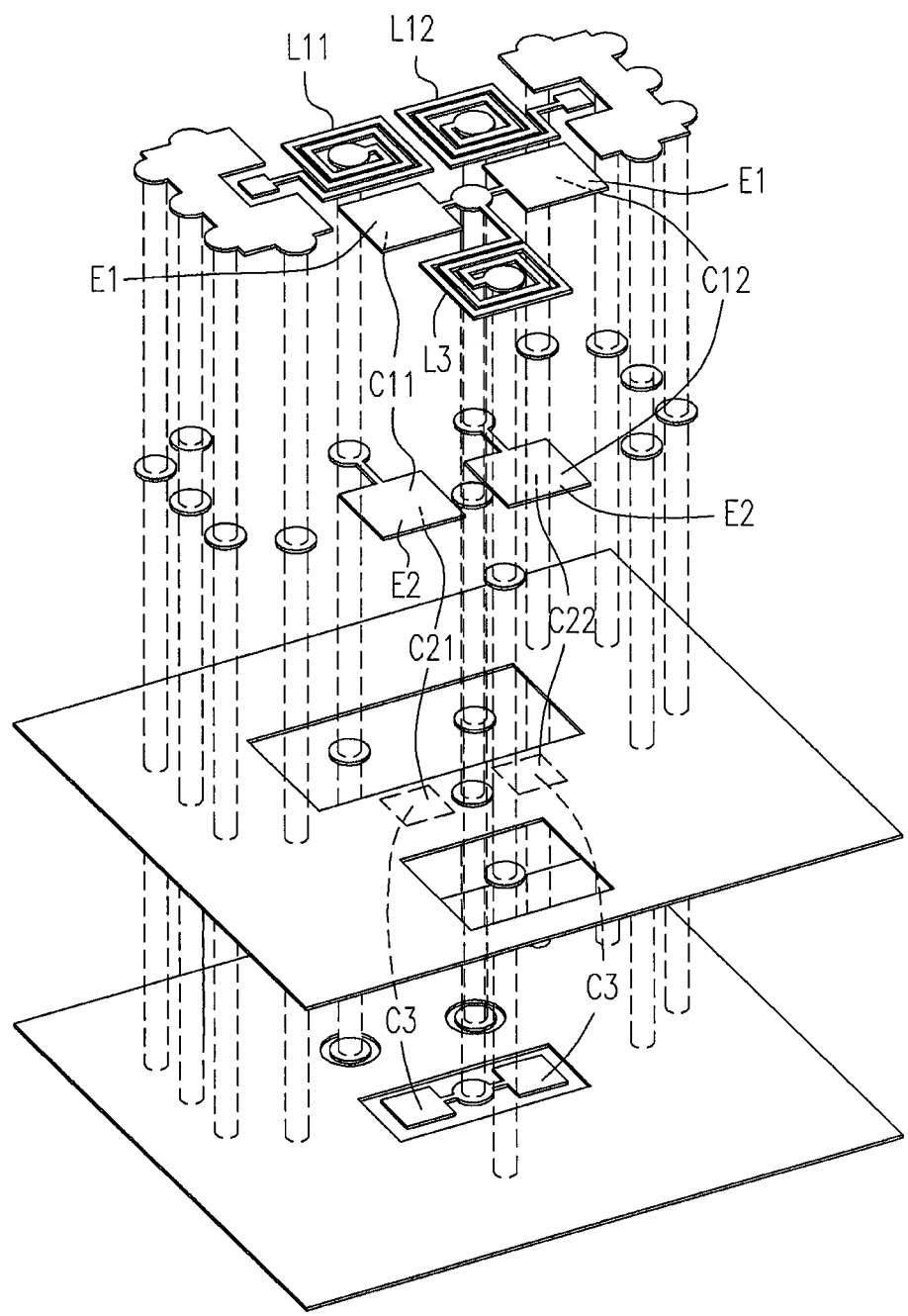
FIG. 10 illustrates a three-dimensional layout of a band pass filter according to another embodiment of the present invention.

FIG. 10 illustrates a three-dimensional layout of a band pass filter according to another embodiment of the present invention. Referring to FIGS. 2 and 10, in order to achieve the mutual capacitor and mutual inductor between the elements, the first serial inductor L11 and the second serial inductor L12 are adjacent in FIG. 10 instead of being non adjacent in FIG. 9, and are adjacent to the first serial capacitor C11 and the second serial capacitor C12. In order to achieve the mutual capacitor Cm1 (mutual capacitor Cm1-L and the mutual capacitor Cm1-R), in this embodiment, the first serial inductor L11 is a planar coil, and another planar electrode E2 of the first serial capacitor C11 and the first serial inductor L11 are adjacent but not coplanar, which makes the mutual capacitor Cm1-L produced from an interaction between the first serial inductor L11 and the first serial capacitor C11. Likewise, the second serial inductor L12 is a planar coil, and another planar electrode E2 of the second serial capacitor C12 and the second serial inductor L12 are adjacent but not coplanar, which makes the mutual capacitor Cm1-R produced from an interaction between the second serial inductor L12 and the second serial capacitor C12.

Figure 11A:
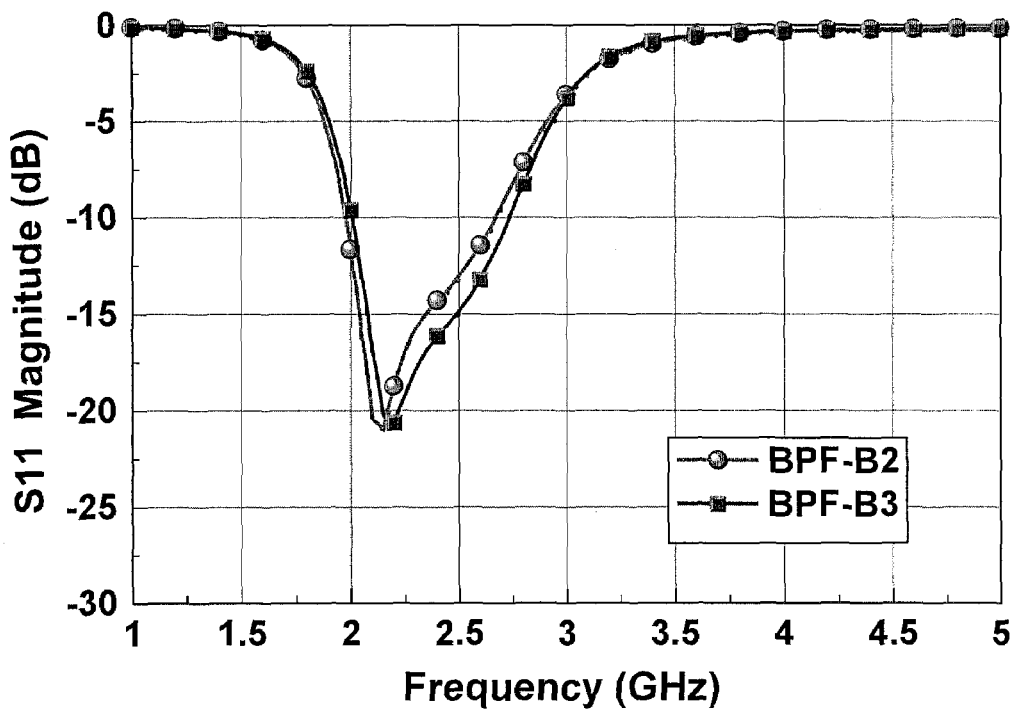
FIGS. 11A and 11B respectively illustrate a scatter parameter comparison of band pass filters FIGS. 9 and 10.
Figure 11B:
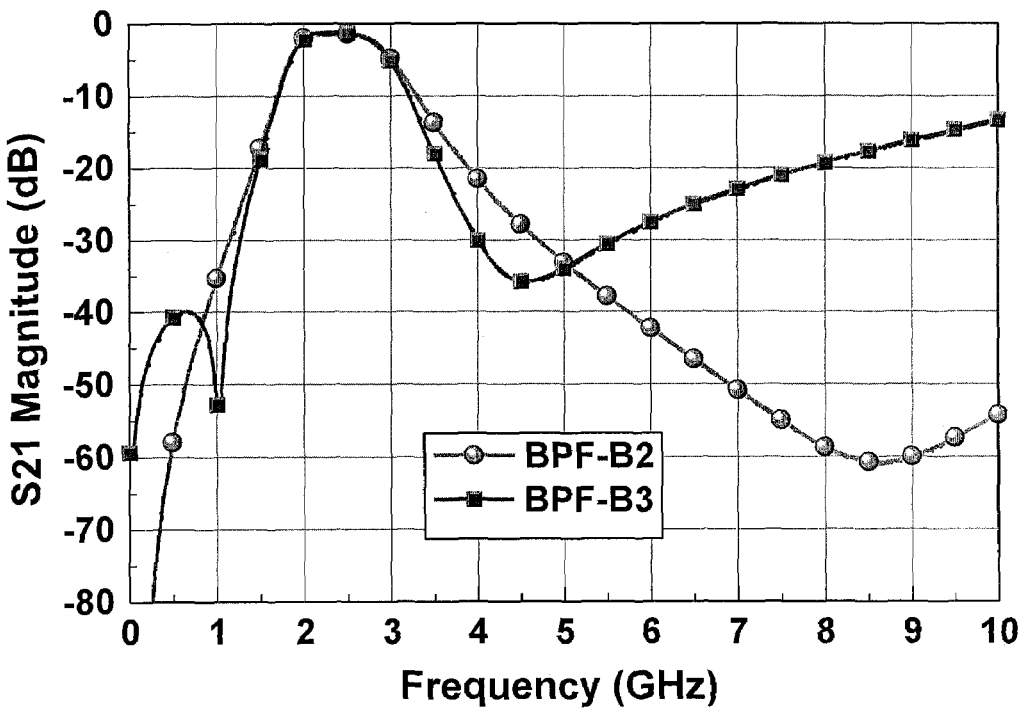

FIGS. 11A and 11B respectively illustrate a scatter parameter comparison of band pass filters FIGS. 9 and 10. Referring to FIG. 11A, the band pass filters (BPF-B2 and BPF-B3) of FIGS. 9 and 10 have similar response intensity of the input signal. Referring to FIG. 11B, two transmission zeros can be obtained at frequency bands near 1 GHz and 4.5 GHz. The noise reduction capability of the band pass filter (BPF-B2) of FIG. 9 is superior to the band pass filter (BPF-B3) of FIG. 10 at a frequency band of above 5 GHz and below 0.8 GHz.

Figure 12:
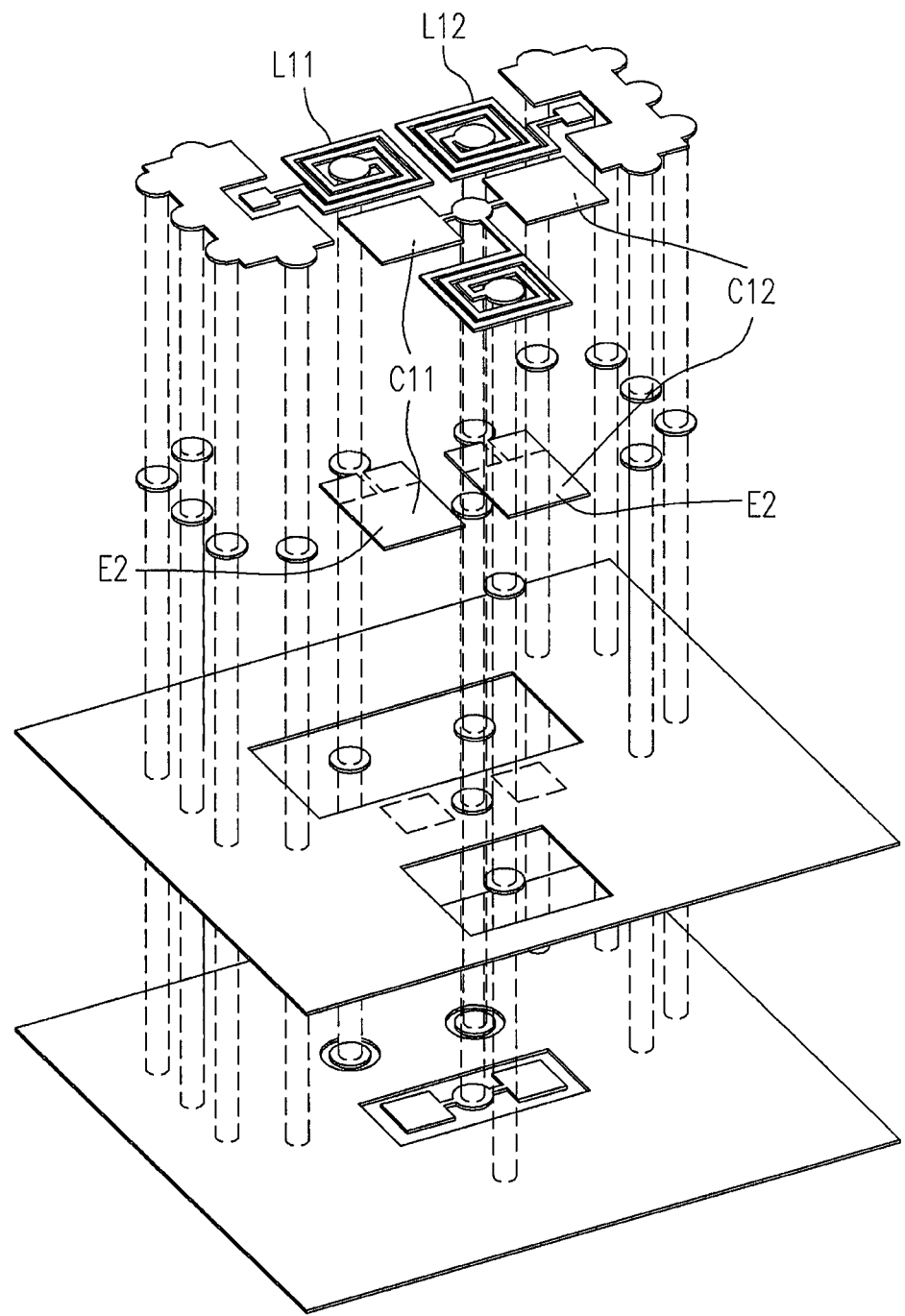
FIG. 12 illustrates a three-dimensional layout of a band pass filter according to another embodiment of the present invention.

FIG. 12 illustrates a three-dimensional layout of a band pass filter according to another embodiment of the present invention. Referring to FIGS. 9 and 12, in this embodiment, in order to increase the mutual capacitor Cm1-L and the mutual capacitor Cm1-R, the planar electrode E2 of the first serial capacitor C11 and the planar electrode E2 of the second serial capacitor C12 may respectively extend below the first serial inductor L11 and the second serial inductor L12. Thus, the planar electrode E2 of the first serial capacitor C11 and the first serial inductor L11 are overlapped at an interval, and the planar electrode E2 of the second serial capacitor C12 and the first serial inductor L12 are overlapped at an interval.

Referring to FIGS. 2 and 10, in order to achieve the mutual capacitor Cm2 (mutual capacitor Cm2-L and mutual capacitor Cm2-R), in this embodiment, the first serial inductor L11 is a planar coil, and a planar electrode E1 of the first serial capacitor C11 and the first serial inductor L11 are adjacent and substantially coplanar, which makes the mutual capacitor Cm2-L produced from an interaction between the first serial inductor L11 and the first serial capacitor C11. Likewise, the second serial inductor L12 is a planar coil, and a planar electrode E1 of the second serial capacitor C12 and the second serial inductor L11 are adjacent and substantially coplanar, which makes the mutual capacitor Cm2-R produced from an interaction between the second serial inductor L12 and the second serial capacitor C12.

Figure 13A:
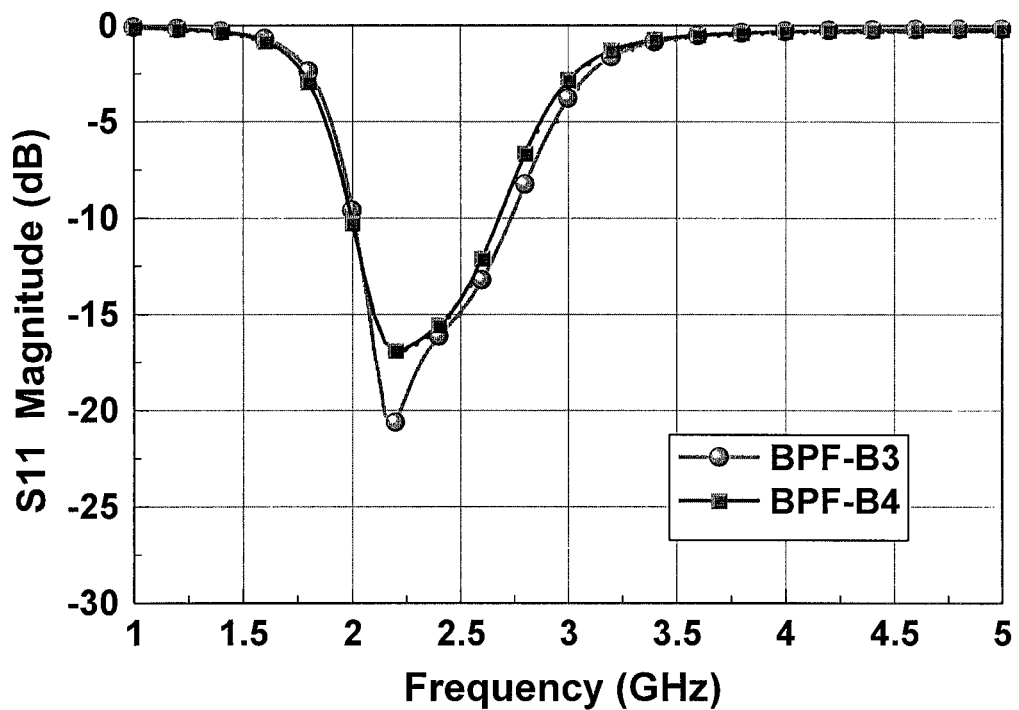
FIGS. 13A and 13B respectively illustrate a scatter parameter comparison of band pass filters of FIGS. 10 and 12.
Figure 13B:
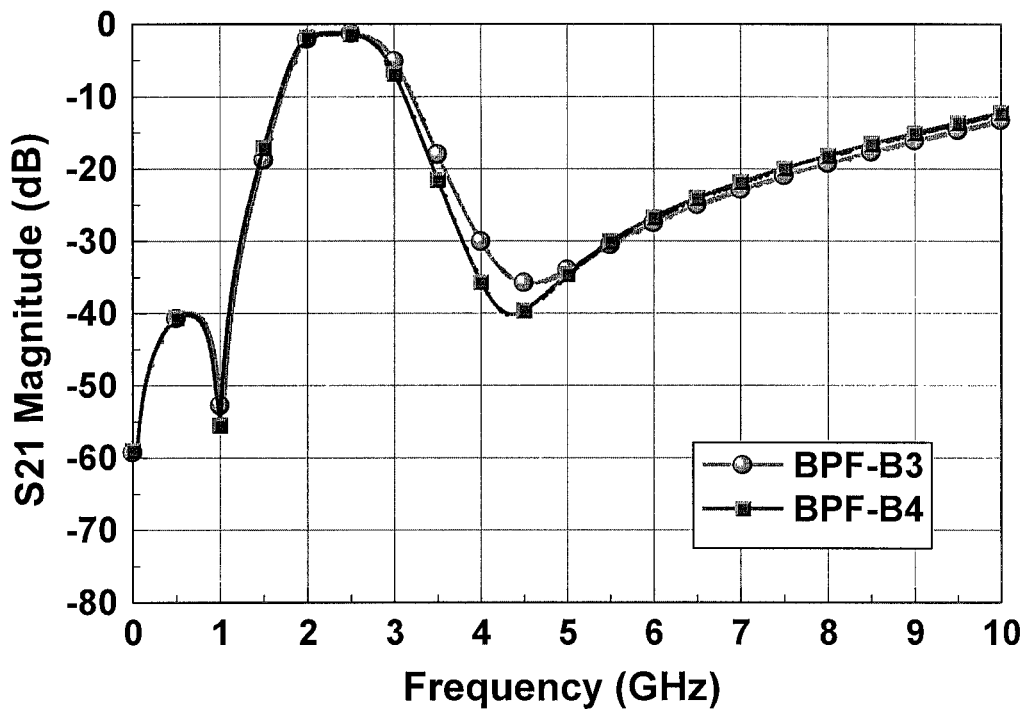

FIGS. 13A and 13B respectively illustrate a scatter parameter comparison of band pass filters of FIGS. 10 and 12. Referring to FIGS. 13A and 13B, the band pass filters (BPF-B3 and BPF-B4) of FIGS. 10 and 12 have similar response intensities of the input signal and output signal.

Figure 14:
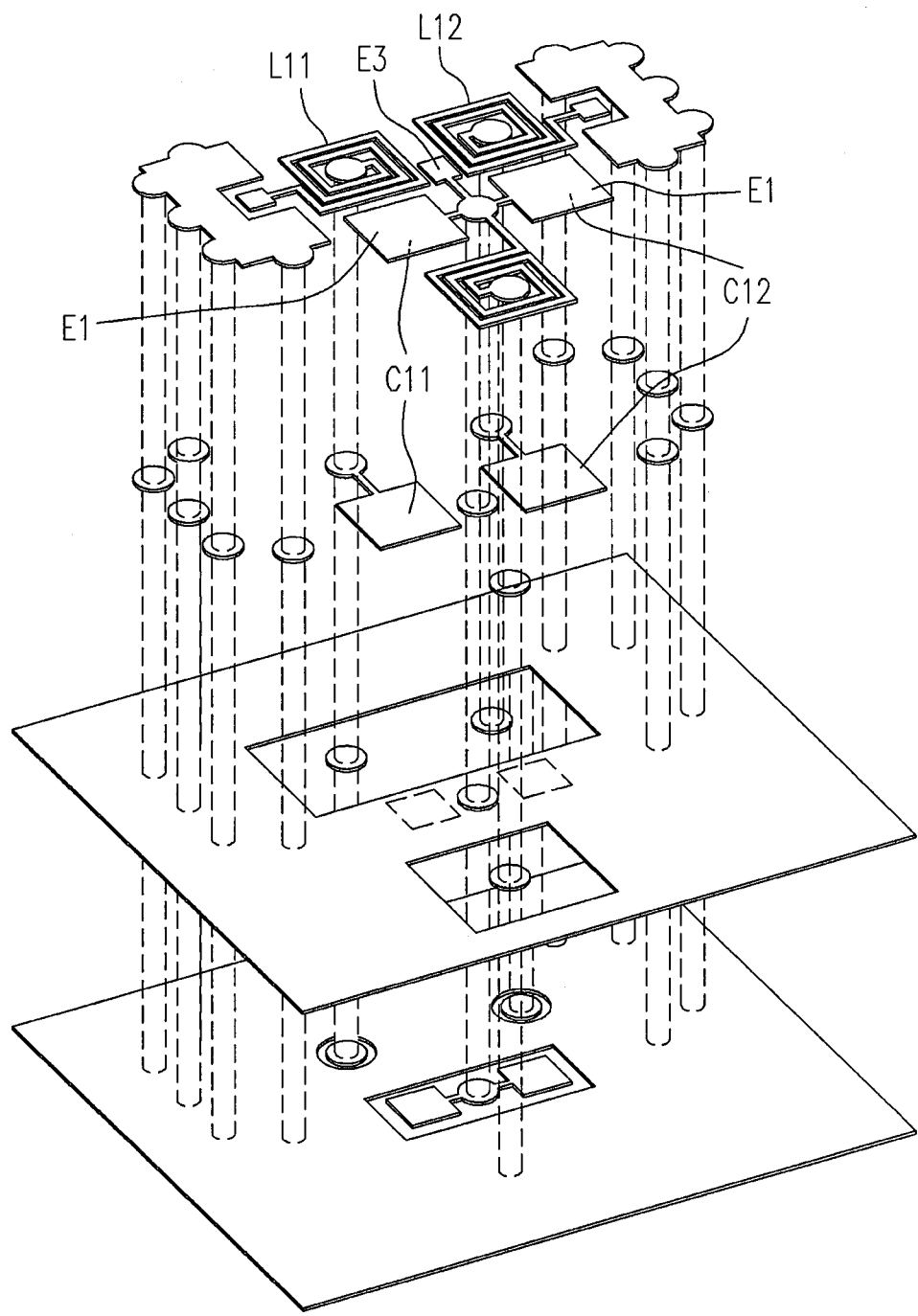
FIG. 14 illustrates a three-dimensional layout of a band pass filter according to another embodiment of the present invention.

FIG. 14 illustrates a three-dimensional layout of a band pass filter according to another embodiment of the present invention. Referring to FIGS. 2 and 14, in this embodiment, in order to increase the mutual capacitor Cm2-L and the mutual capacitor Cm2-R, the first serial capacitor C11 or the second serial capacitor C12 has a planar electrode E3, which is located between the first serial inductor and the second serial inductor and adjacent to the first serial inductor L11 and the second serial inductor L12. Therefore, the planar electrode E3 may increase the mutual area of the first serial capacitor C11 and the first serial inductor L11, and increase the mutual area of the second serial capacitor C12 and the second serial inductor L12.

Referring to FIGS. 2 and 10 again, in order to achieve the mutual capacitor Cm3 (mutual capacitor Cm3-L and mutual capacitor Cm3-R), in this embodiment, the first serial inductor L11 is a planar coil, and a planar electrode E2 of the second serial capacitor C12 is adjacent to the first serial inductor L11, which makes the mutual capacitor Cm3-L produced from an interaction between the first serial inductor L11 and the second serial capacitor C12. Likewise, the second serial inductor L12 is a planar coil, and a planar electrode E2 of the first serial capacitor C11 is adjacent to the second serial inductor L12, which makes the mutual capacitor Cm3-R produced from an interaction between the second serial inductor L12 and a serial capacitor C11.

Figure 15A:
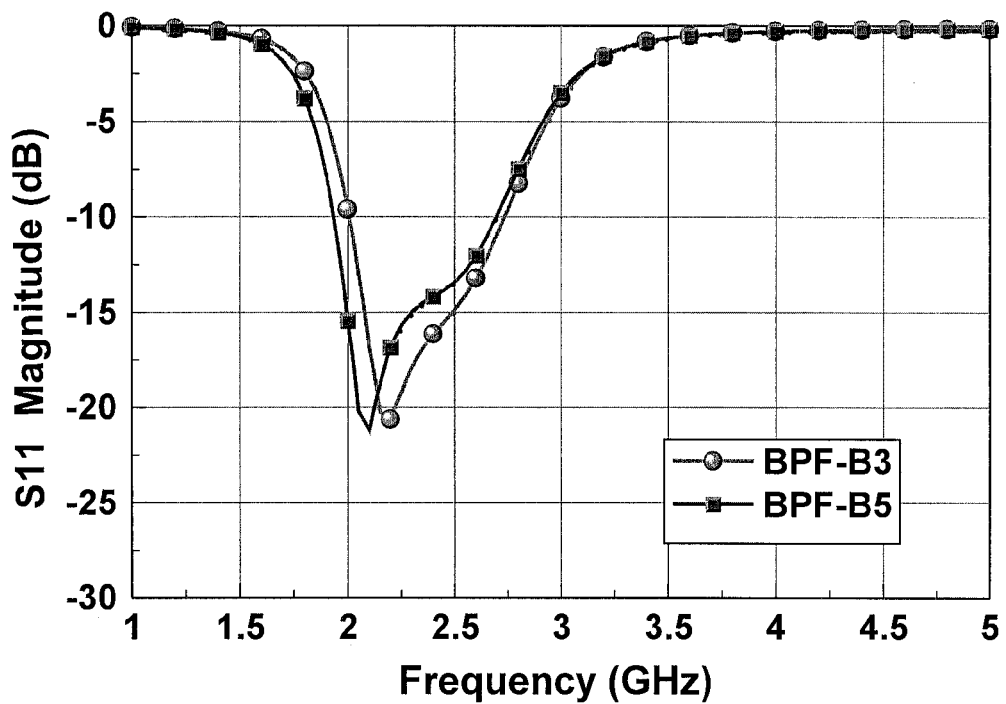
FIGS. 15A and 15B respectively illustrate a scatter parameter comparison of band pass filters of FIGS. 10 and 14.
Figure 15B:
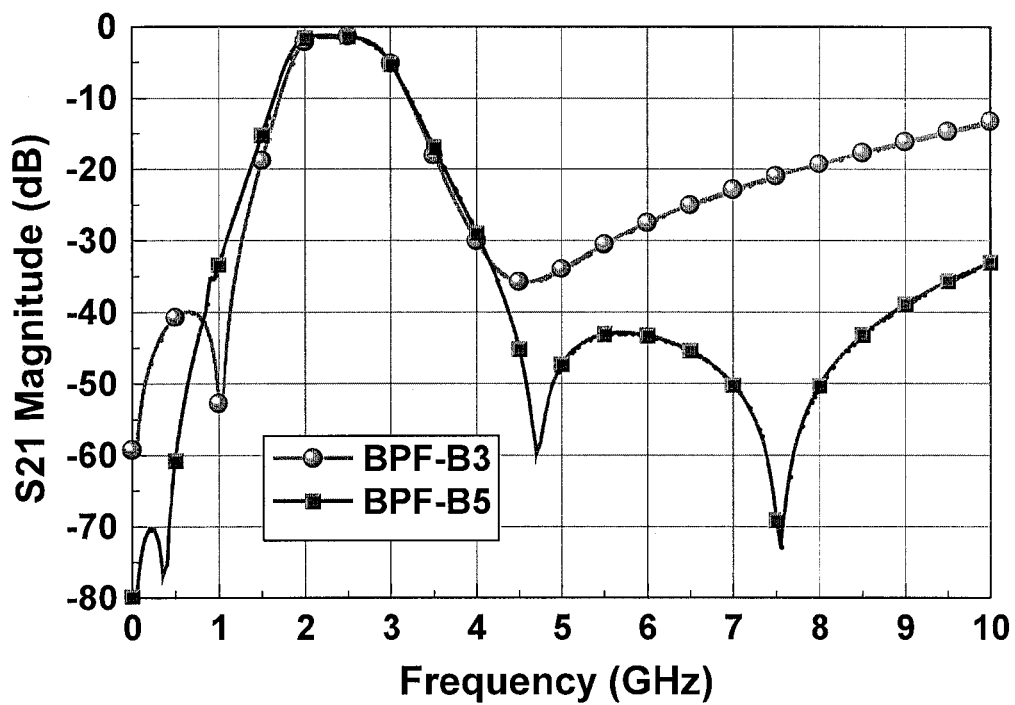

FIGS. 15A and 15B respectively illustrate a scatter parameter comparison of band pass filters of FIGS. 10 and 14. Referring to FIG. 15A, the band pass filters (BPF-B3 and BPF-B5) of FIGS. 10 and 14 have similar response intensities of the input signal. Referring to FIGS. 15B and 14, the band pass filter (BPF-B5) has three transmission zeros, two more transmission zeros at high frequency band, so the noise reduction capability is superior to the band pass filter (BPF-B3) having only one transmission zero of FIG. 10.

Figure 16:
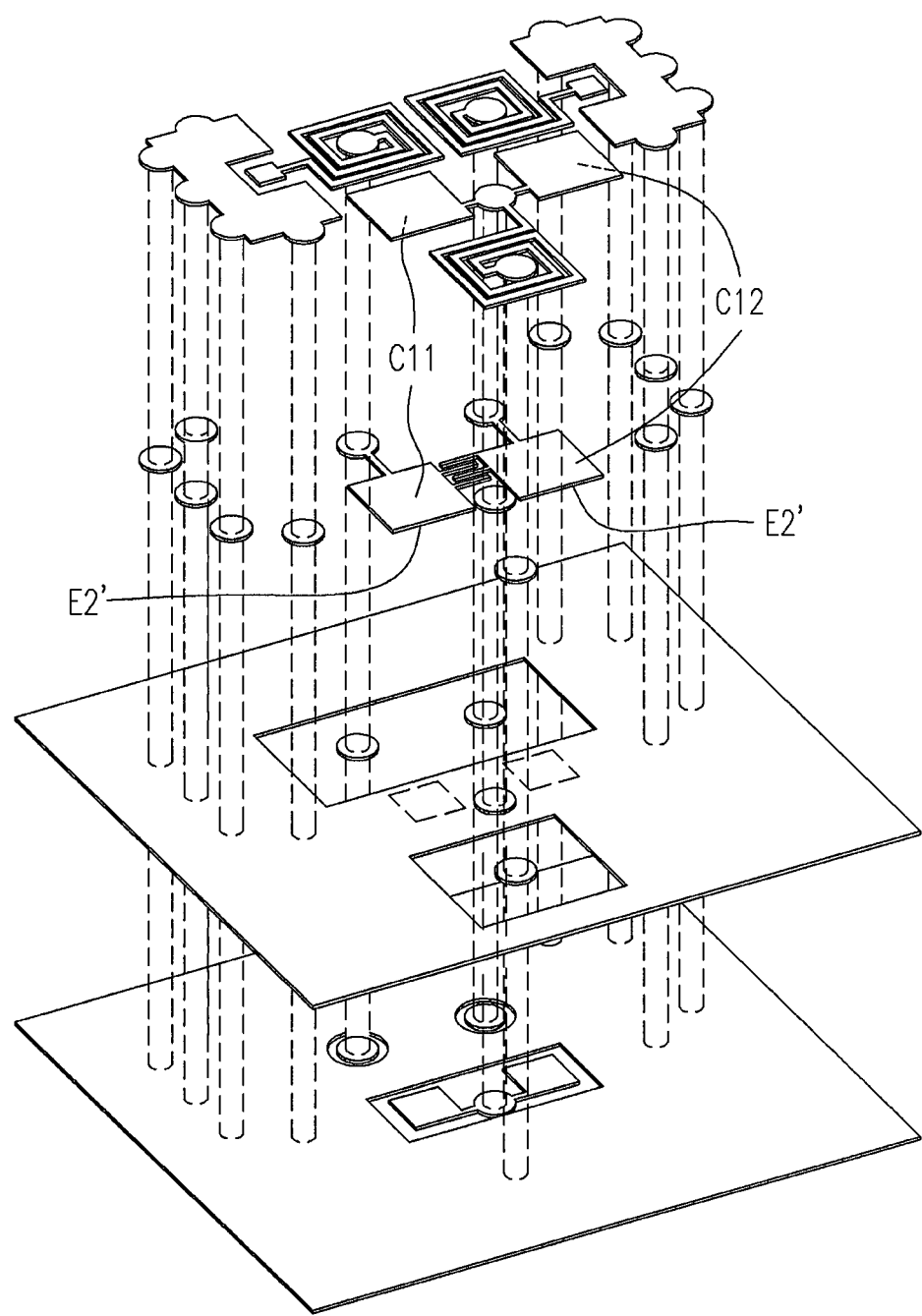
FIG. 16 illustrates a three-dimensional layout of a band pass filter according to another embodiment of the present invention.

FIG. 16 illustrates a three-dimensional layout of a band pass filter according to another embodiment of the present invention. Referring to FIGS. 2 and 16, in order to achieve mutual capacitor Cm4, in this embodiment, each of the first serial capacitor C11 and the second serial capacitor C12 has a multi-finger planar electrode E2', and the fingers of the multi-finger planar electrodes E2' are staggered at an interval.

Referring to FIGS. 2 and 10 again, in order to achieve the mutual capacitor Cm5 and the mutual inductor Lm, the first serial inductor L11 and the second serial inductor L12 are adjacent in FIG. 10 instead of being non adjacent in FIG. 9. In this embodiment, the first serial inductor L11 and the second serial inductor L12 are two planar coils which are adjacent and substantially coplanar.

Figure 17A:
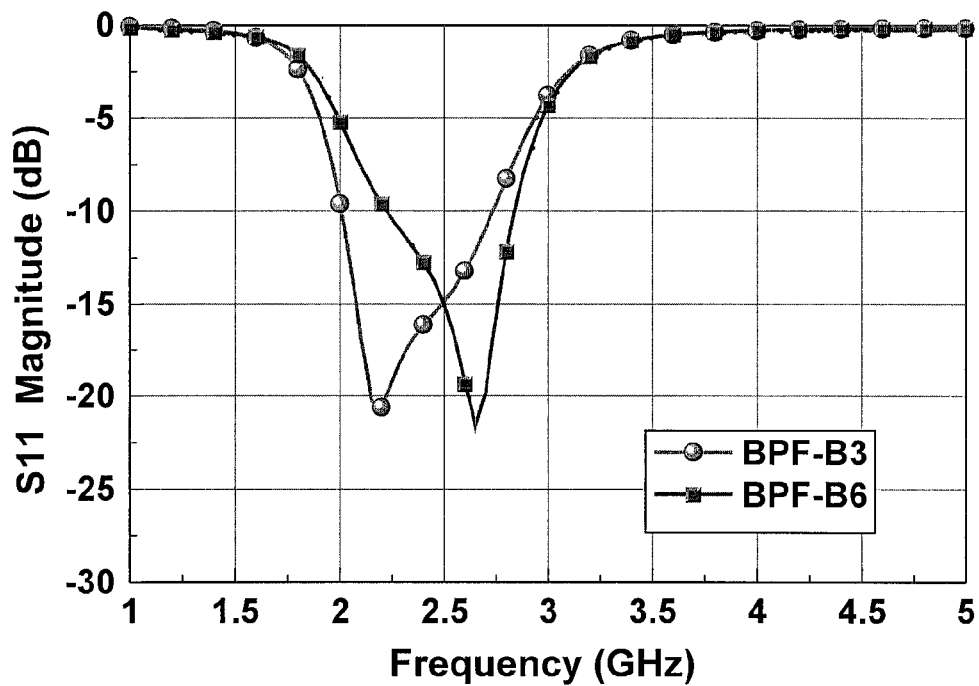
FIGS. 17A and 17B respectively illustrate a scatter parameter comparison of band pass filters of FIGS. 10 and 16.
Figure 17B:
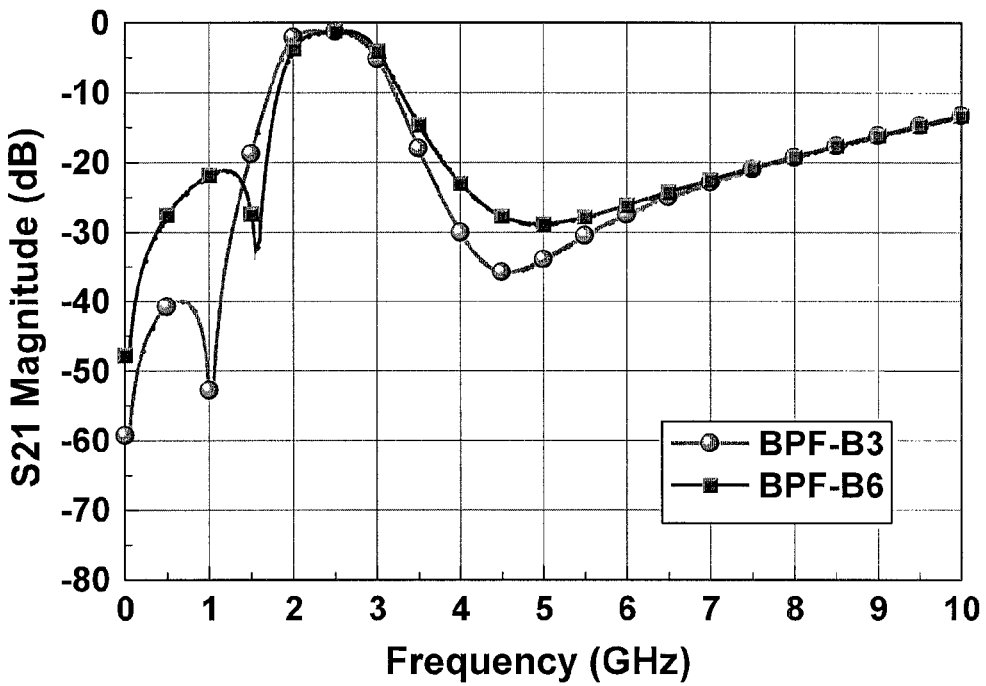

FIGS. 17A and 17B respectively illustrate a scatter parameter comparison of band pass filters of FIGS. 10 and 16. Referring to FIG. 17A, the band pass filters (BPF-B3 and BPF-B6) of FIGS. 10 and 16 have similar response intensities of the input signal. Referring to FIG. 17B, the noise reduction capability of band pass filter (BPF-B6) of FIG. 16 is superior to that of the band pass filter (BPF-B3) of FIG. 10 at a frequency band below 1.4 GHz.

Figure 18:
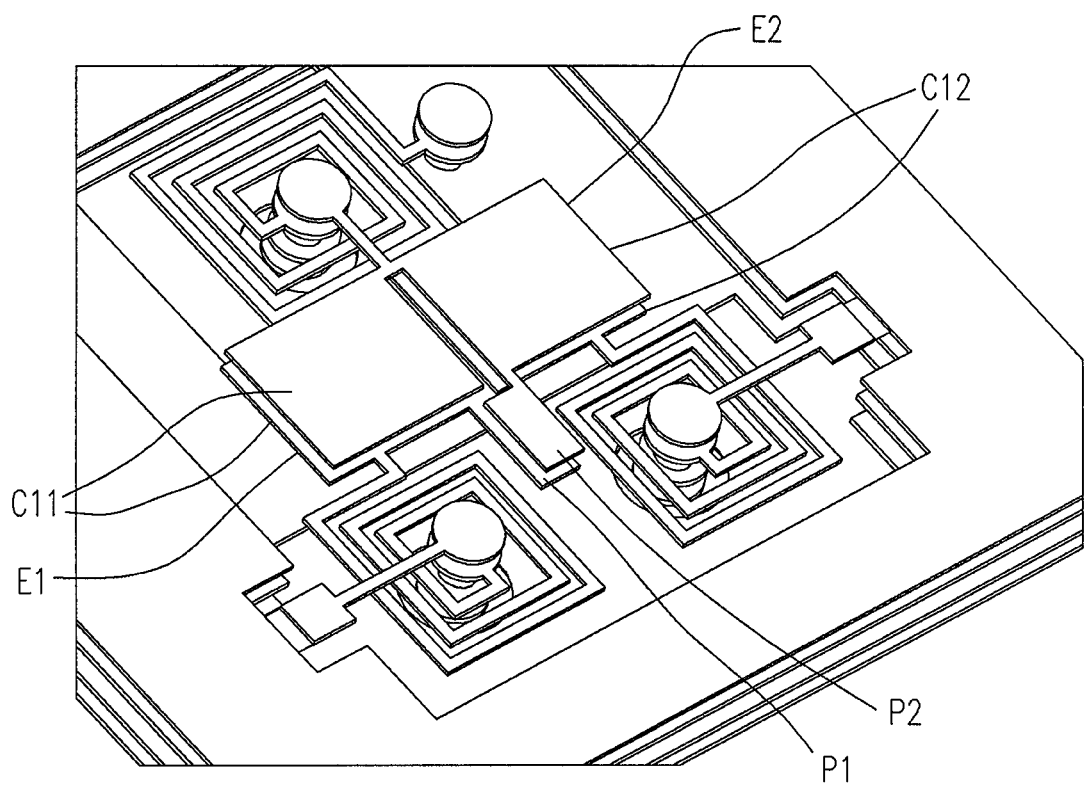
FIG. 18 illustrates a three-dimensional layout of a band pass filter according to another embodiment of the present invention.
Figure 19:
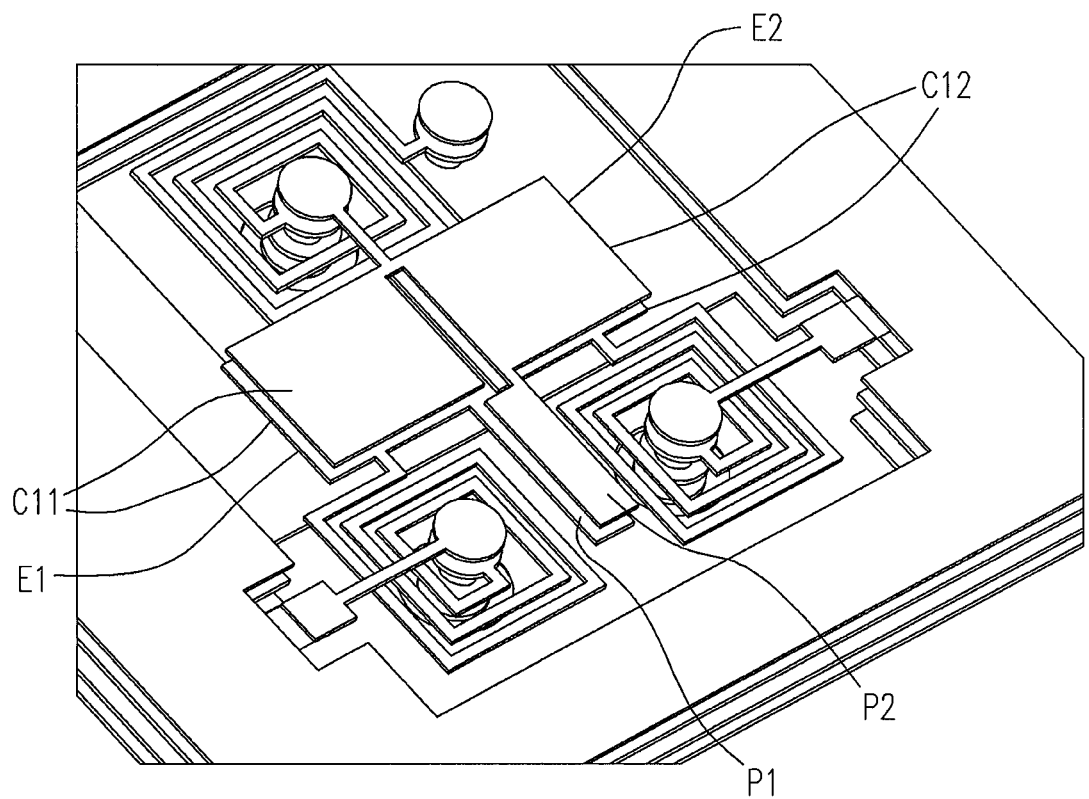
FIG. 19 illustrates a three-dimensional layout of a band pass filter according to another embodiment of the present invention.
Figure 20:
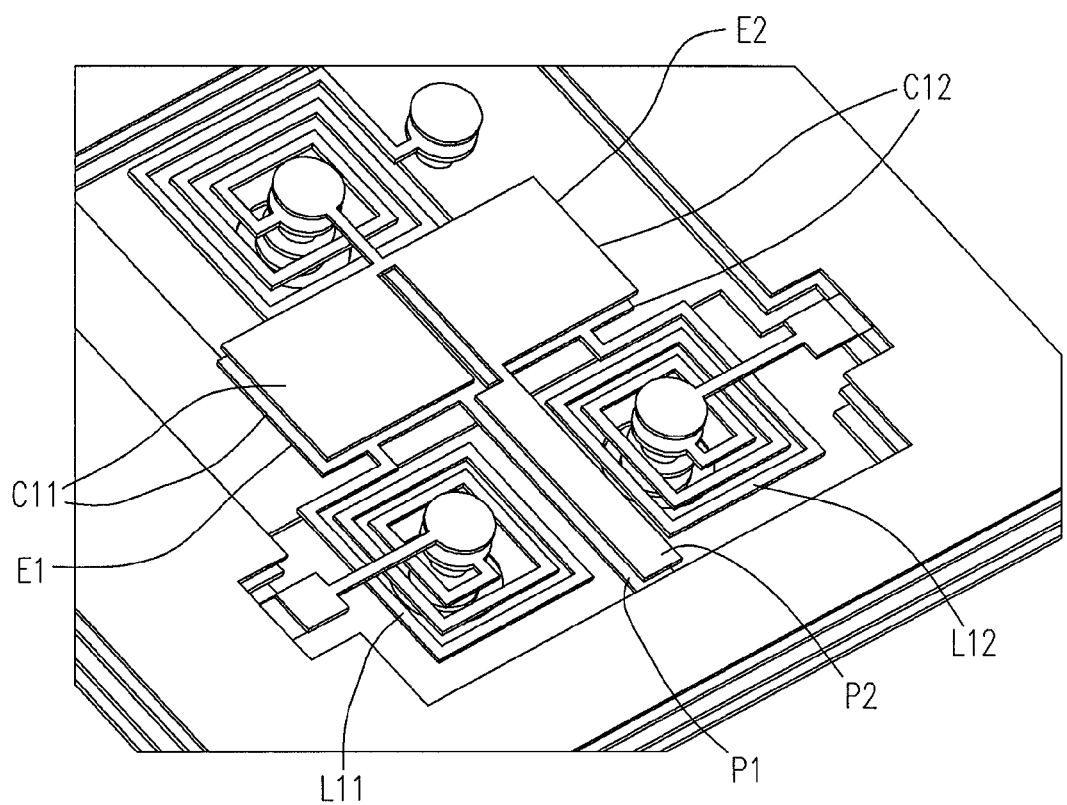
FIG. 20 illustrates a three-dimensional layout of a band pass filter according to another embodiment of the present invention.

The three-dimensional layouts of three embodiments illustrated in FIGS. 18 to 20 are similar to the three-dimensional layout illustrated in FIG. 14.

FIG. 18 illustrates a three-dimensional layout of a band pass filter according to another embodiment of the present invention. Referring to FIGS. 2 and 18, in this embodiment, in order to increase the transmission zero, the first serial inductor L11 and the second serial inductor L12 are two planar coils, and a part P1 of the planar electrode E1 of the first serial capacitor C11 is located between the first serial inductor L11 and the second serial inductor L12, and is adjacent to the first serial inductor L11 and the second serial inductor L12. Furthermore, a part P2 of the planar electrode E2 of the second serial capacitor C12 and the part P1 of the planar electrode E1 of the first serial capacitor C11 are totally overlapped on a horizontal projection plane.

FIG. 19 illustrates a three-dimensional layout of a band pass filter according to another embodiment of the present invention. Referring to FIGS. 2 and 19, compared with FIG. 18, in this embodiment, the part P1 and the part P2 are adjusted to be slightly longer at the same time.

FIG. 20 illustrates a three-dimensional layout of a band pass filter according to another embodiment of the present invention. Referring to FIGS. 2 and 20, compared with FIG. 18, in this embodiment, the part P1 and the part P2 are adjusted to be longer at the same time.

Figure 21:
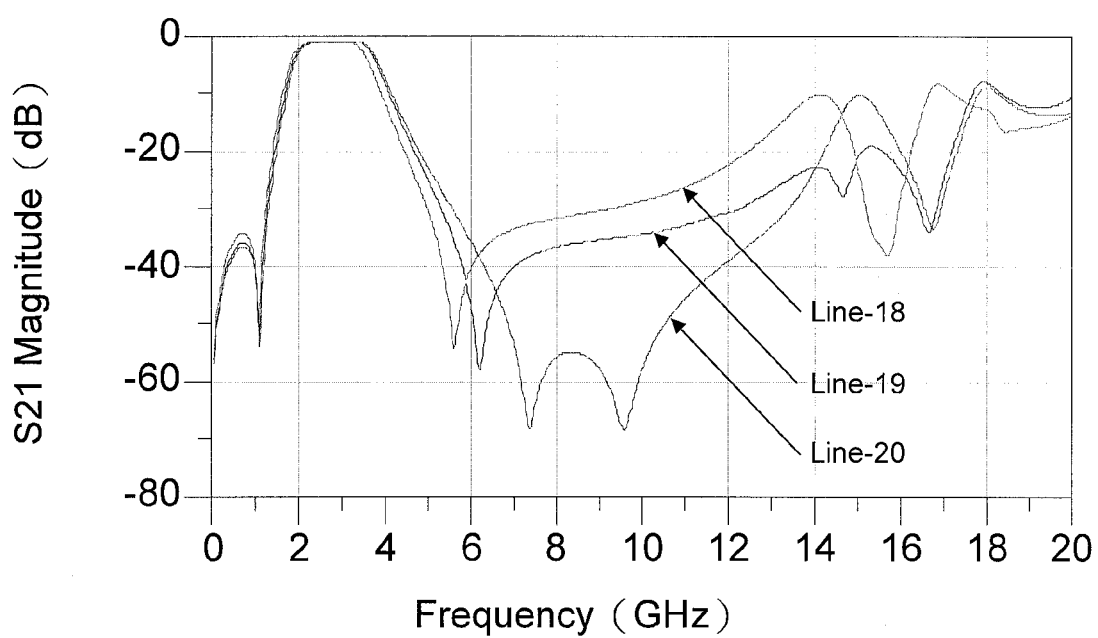
FIG. 21 illustrates a scatter parameter comparison of band pass filters of FIGS. 18 to 20.

FIG. 21 illustrates a scatter parameter comparison of band pass filters of FIGS. 18 to 20. Referring to FIG. 21, the Line-18, Line-19 and Line-20 sequentially represent frequency response curves of the output signals of the band pass filters of FIGS. 18, 19, and 20. Seen from FIG. 21, the band pass filters of FIG. 18 to FIG. 20 each have at least two transmission zeros to suppress the noise.

Figure 22:
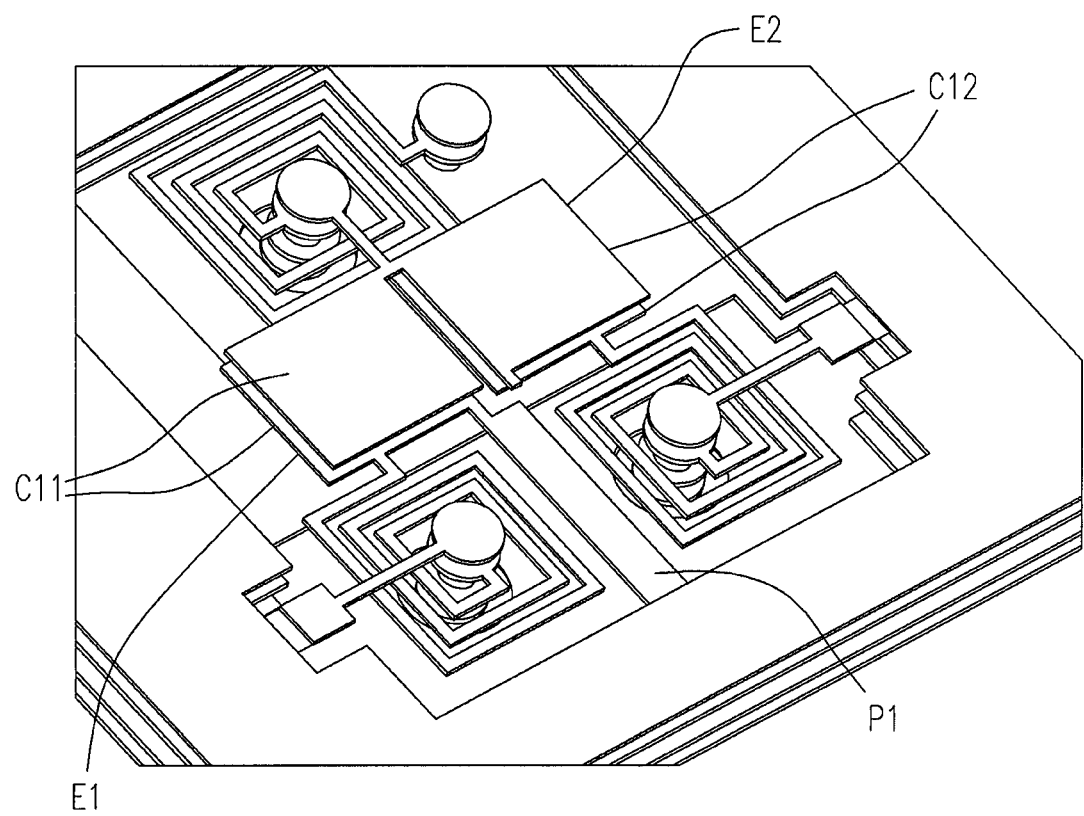
FIG. 22 illustrates a three-dimensional layout of a band pass filter according to another embodiment of the present invention.

FIG. 22 illustrates a three-dimensional layout of a band pass filter according to another embodiment of the present invention. Referring to FIGS. 2 and 22, compared with FIG. 18, in this embodiment, the part P1 of the planar electrode E1 of the first serial capacitor C11 is kept, but the part P2 of the planar electrode E2 of the second serial capacitor C12 is removed.

Figure 23:
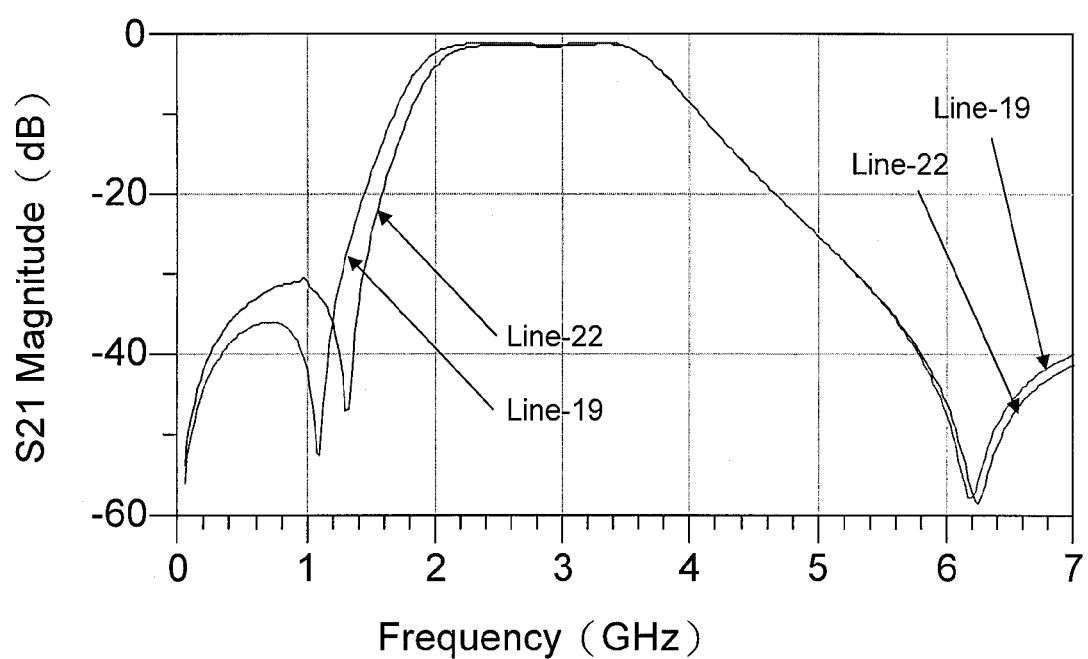
FIG. 23 illustrates a scatter parameter comparison of band pass filters of FIGS. 18 and 22.

FIG. 23 illustrates a scatter parameter comparison of band pass filters of FIGS. 18 and 22. Referring to FIG. 23, the Line-18 and Line-22 respectively represent frequency response curves of the output signals of the band pass filters of FIGS. 18 and 22.

Figure 24:
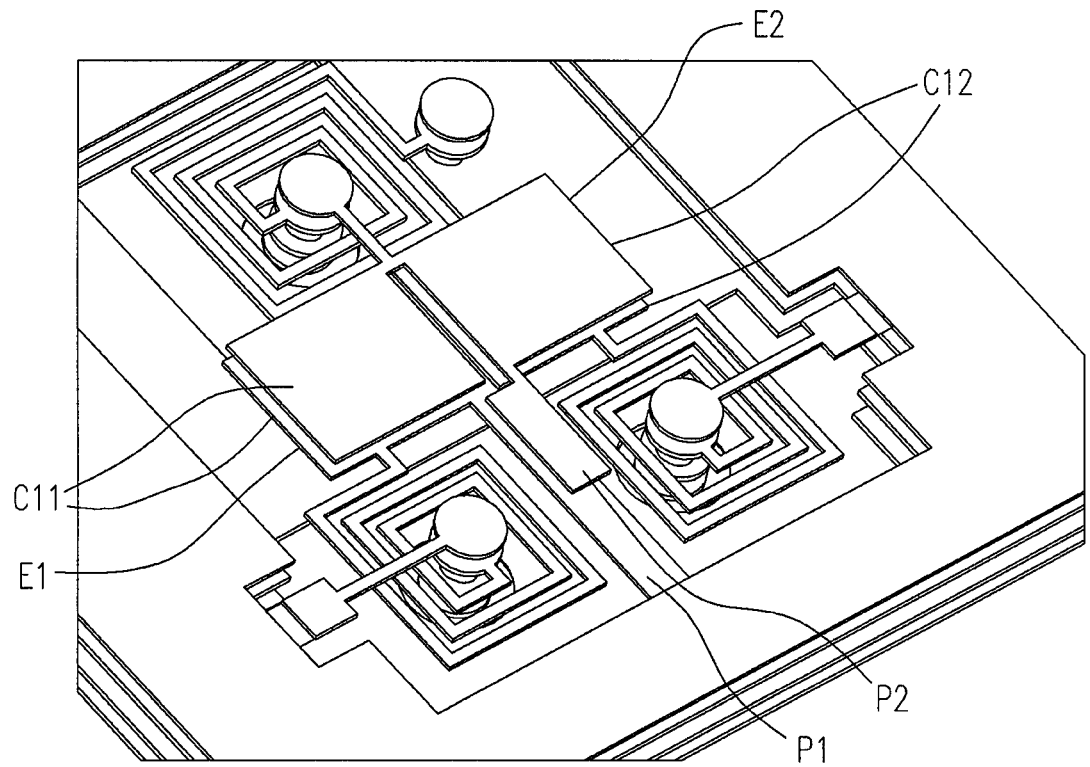
FIG. 24 illustrates a three-dimensional layout of a band pass filter according to another embodiment of the present invention.

FIG. 24 illustrates a three-dimensional layout of a band pass filter according to another embodiment of the present invention. Referring to FIGS. 2 and 24, compared with FIG. 19, only the length of the part P1 is adjusted. In other words, the part P1 and the part P2 have different lengths, such that the part P2 of the planar electrode E2 of the second serial capacitor C12 and the part P1 of the planar electrode E1 of the first serial capacitor C11 are partially overlapped on the horizontal projection plane.

Figure 25:
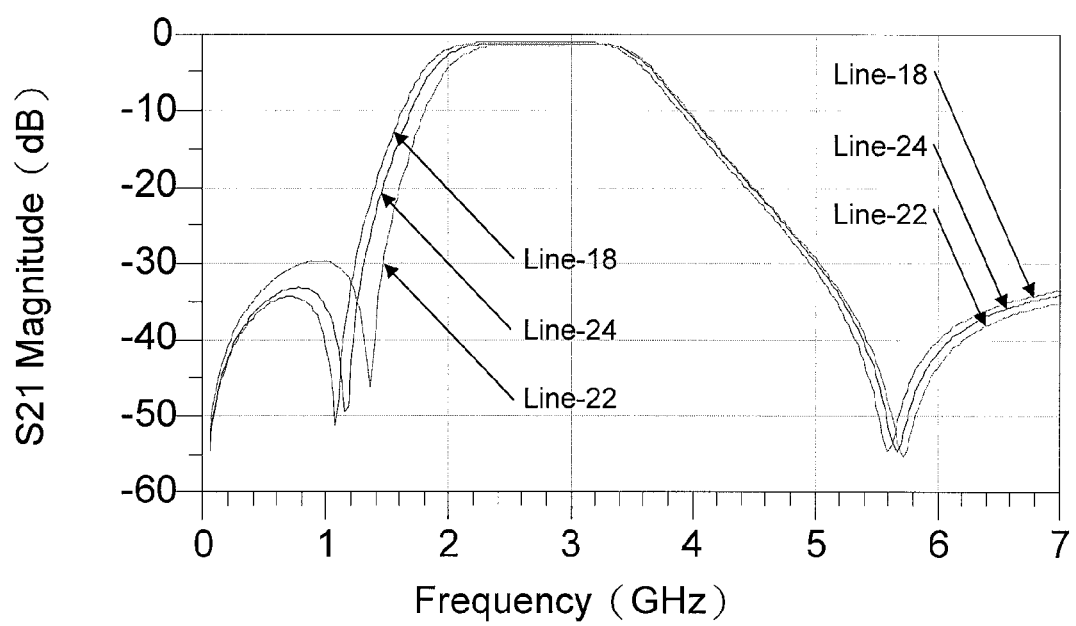
FIG. 25 illustrates a scatter parameter comparison of band pass filters of FIGS. 18, 22, and 24.

FIG. 25 illustrates a scatter parameter comparison of band pass filters of FIGS. 18, 22, and 24. Referring to FIG. 25, the Line-18, Line-22, and Line-24 sequentially represent frequency response curves of the output signals of the band pass filters of FIGS. 18, 22, and 24.

In the above embodiments, various dielectric materials, such as low temperature cofired ceramics (LTCC), organic materials, and liquid crystal polymer (LCP), may be used to electrically isolate the conductive patterns. Furthermore, the above embodiments may be fabricated into a single independent element, or directly formed in a certain block of the circuit board in the course of circuit board fabrication, while other blocks of the circuit board may be formed with other circuits.

To sum up, the present invention may make the mutual circuit formed by the mutual capacitor or the mutual inductor produced between the elements of the original circuit of the band pass filter to constitute a resonance circuit with the original circuit to produce one or more transmission zero without increasing the size of the band pass filter and the response of the pass band, so as to increase the attenuation rate of the stop band.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A band pass filter, comprising:
a first serial inductor;
a first serial capacitor, with one end electrically connected to one end of the first serial inductor;
a second serial capacitor, with one end electrically connected to the other end of the first serial capacitor;
a second serial inductor, with one end electrically connected to the other end of the second serial capacitor;
a first branch capacitor, with one end electrically connected to the one end of the first serial inductor, and the other end electrically connected to ground;
a second branch capacitor, with one end electrically connected to the other end of the second serial capacitor, and the other end electrically connected to ground;
a central capacitor, with one end electrically connected to the other end of the first serial capacitor, and the other end electrically connected to ground; and
a central inductor, with one end electrically connected to the other end of the first serial capacitor, and the other end electrically connected to ground,
wherein the above elements form an original circuit, and an interaction of at least two of the above elements produces a mutual capacitor or a mutual inductor, which constitutes a resonance circuit with the original circuit to produce at least a transmission zero, the mutual capacitor is produced from an interaction between the first serial capacitor and the second serial capacitor.

2. A band pass filter, comprising:
a first serial inductor;
a first serial capacitor, with one end electrically connected to one end of the first serial inductor;
a second serial capacitor, with one end electrically connected to the other end of the first serial capacitor;
a second serial inductor, with one end electrically connected to the other end of the second serial capacitor;
a first branch capacitor, with one end electrically connected to the one end of the first serial inductor, and the other end electrically connected to ground;
a second branch capacitor, with one end electrically connected to the other end of the second serial capacitor, and the other end electrically connected to ground;
a central capacitor, with one end electrically connected to the other end of the first serial capacitor, and the other end electrically connected to ground; and
a central inductor, with one end electrically connected to the other end of the first serial capacitor, and the other end electrically connected to ground,
wherein the above elements form an original circuit, and an interaction of at least two of the above elements produces a mutual capacitor or a mutual inductor, which constitutes a resonance circuit with the original circuit to produce at least a transmission zero, wherein the mutual capacitor is produced from an interaction between the first serial inductor and the first serial capacitor.

3. The band pass filter according to claim 2, wherein the first serial inductor is a planar coil, and a planar electrode of the first serial capacitor is adjacent to but not coplanar with the first serial inductor.

4. The band pass filter according to claim 2, wherein the first serial inductor is a planar coil, and a planar electrode of the first serial capacitor is adjacent to and substantially coplanar with the first serial inductor.

5. A band pass filter, comprising:
a first serial inductor;
a first serial capacitor, with one end electrically connected to one end of the first serial inductor;
a second serial capacitor, with one end electrically connected to the other end of the first serial capacitor;
a second serial inductor, with one end electrically connected to the other end of the second serial capacitor;
a first branch capacitor, with one end electrically connected to the one end of the first serial inductor, and the other end electrically connected to ground;
a second branch capacitor, with one end electrically connected to the other end of the second serial capacitor, and the other end electrically connected to ground;
a central capacitor, with one end electrically connected to the other end of the first serial capacitor, and the other end electrically connected to ground; and
a central inductor, with one end electrically connected to the other end of the first serial capacitor, and the other end electrically connected to ground,
wherein the above elements form an original circuit, and an interaction of at least two of the above elements produces a mutual capacitor or a mutual inductor, which constitutes a resonance circuit with the original circuit to produce at least a transmission zero, wherein the mutual capacitor is produced from an interaction between the first serial inductor and the second serial inductor.

* * * * *